United States Patent
Maeda

(10) Patent No.: US 11,444,598 B2
(45) Date of Patent: Sep. 13, 2022

(54) ACOUSTIC WAVE FILTER

(71) Applicant: Murata Manufacturing Co., Ltd., Nagaokakyo (JP)

(72) Inventor: Kenta Maeda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 373 days.

(21) Appl. No.: 16/739,171

(22) Filed: Jan. 10, 2020

(65) Prior Publication Data
US 2020/0244247 A1 Jul. 30, 2020

(30) Foreign Application Priority Data

Jan. 30, 2019 (JP) .............................. JP2019-014377

(51) Int. Cl.
| | | |
|---|---|---|
| *H03H 9/145* | (2006.01) | |
| *H03H 9/02* | (2006.01) | |
| *H03H 9/64* | (2006.01) | |
| *H03H 9/25* | (2006.01) | |

(52) U.S. Cl.
CPC .... *H03H 9/14526* (2013.01); *H03H 9/02834* (2013.01); *H03H 9/02866* (2013.01); *H03H 9/02937* (2013.01); *H03H 9/02992* (2013.01); *H03H 9/25* (2013.01); *H03H 9/6483* (2013.01)

(58) Field of Classification Search
CPC .......... H03H 9/14526; H03H 9/02834; H03H 9/02866; H03H 9/02937; H03H 9/02992; H03H 9/25; H03H 9/6483; H03H 9/0274

USPC .......................................... 333/133, 193–196
See application file for complete search history.

(56) References Cited

U.S. PATENT DOCUMENTS

2004/0027213 A1 2/2004 Takata
2020/0052675 A1* 2/2020 Kanazawa ............... H03H 9/72

FOREIGN PATENT DOCUMENTS

JP 2004-023611 A 1/2004

* cited by examiner

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave filter includes series arm resonators each including an IDT electrode on a piezoelectric substrate. Resonant frequencies of the series arm resonators are positioned within the pass band of the acoustic wave filter. The IDT electrode includes a pair of comb-shaped electrodes. Each of the comb-shaped electrodes includes electrode fingers and a busbar electrode. The electrode fingers extend in a direction intersecting a propagation direction of acoustic waves and are parallel with each other. One end of an electrode finger and one end of another electrode finger are connected with each other by the busbar electrode. The IDT electrode of the series arm resonator with the lowest antiresonant frequency includes two or more withdrawal-weighted floating electrodes without any of the electrode fingers of one of the comb-shaped electrodes interposed therebetween.

20 Claims, 13 Drawing Sheets

FIRST EXAMPLE (ACOUSTIC WAVE FILTER 10A)

SAW PROPAGATION DIRECTION

FIG. 4A      FIRST EXAMPLE (ACOUSTIC WAVE FILTER 10A)
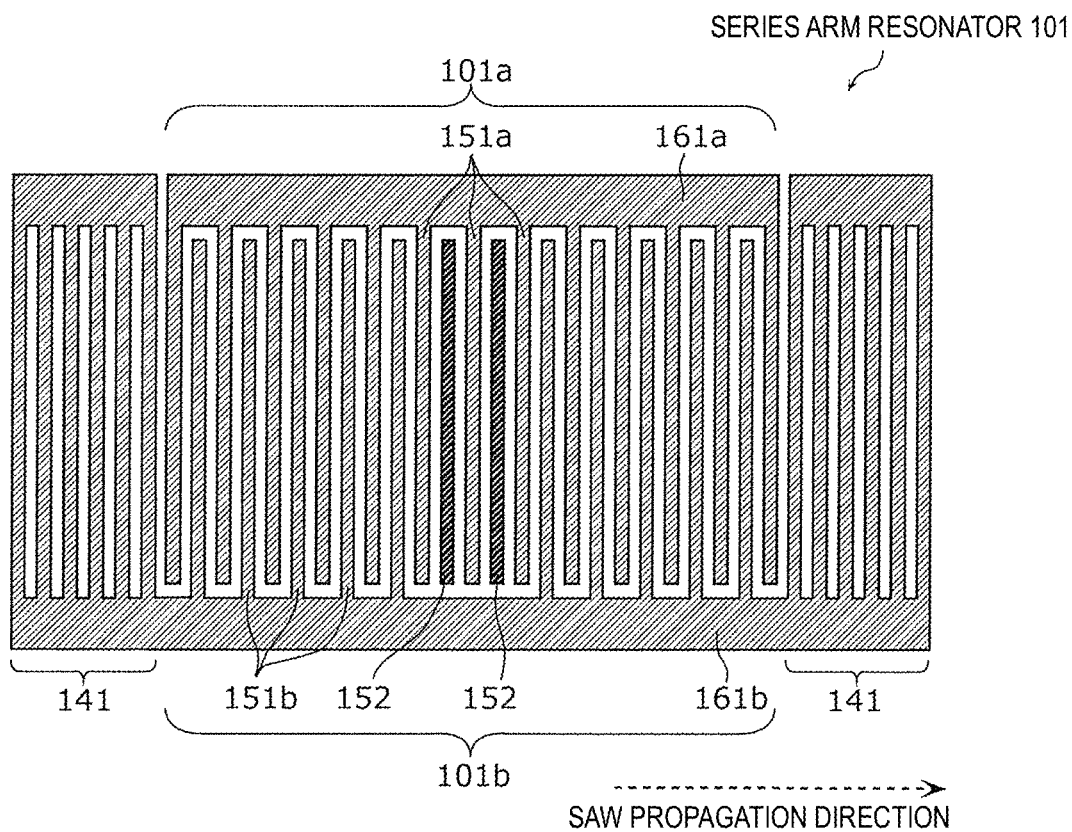
FIG. 4B
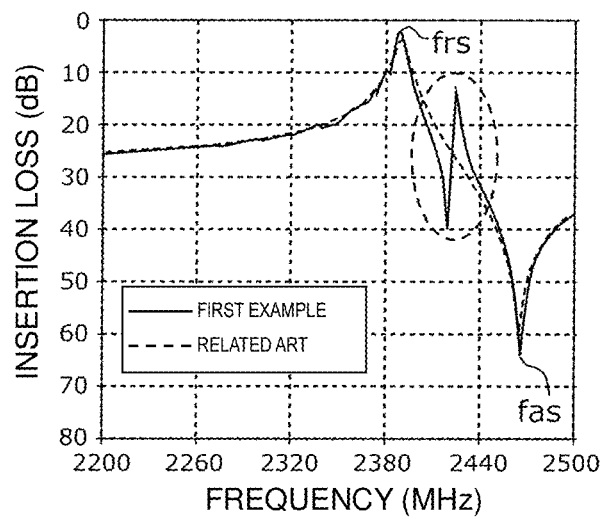

FIG. 5A    SECOND EXAMPLE (ACOUSTIC WAVE FILTER 10B)
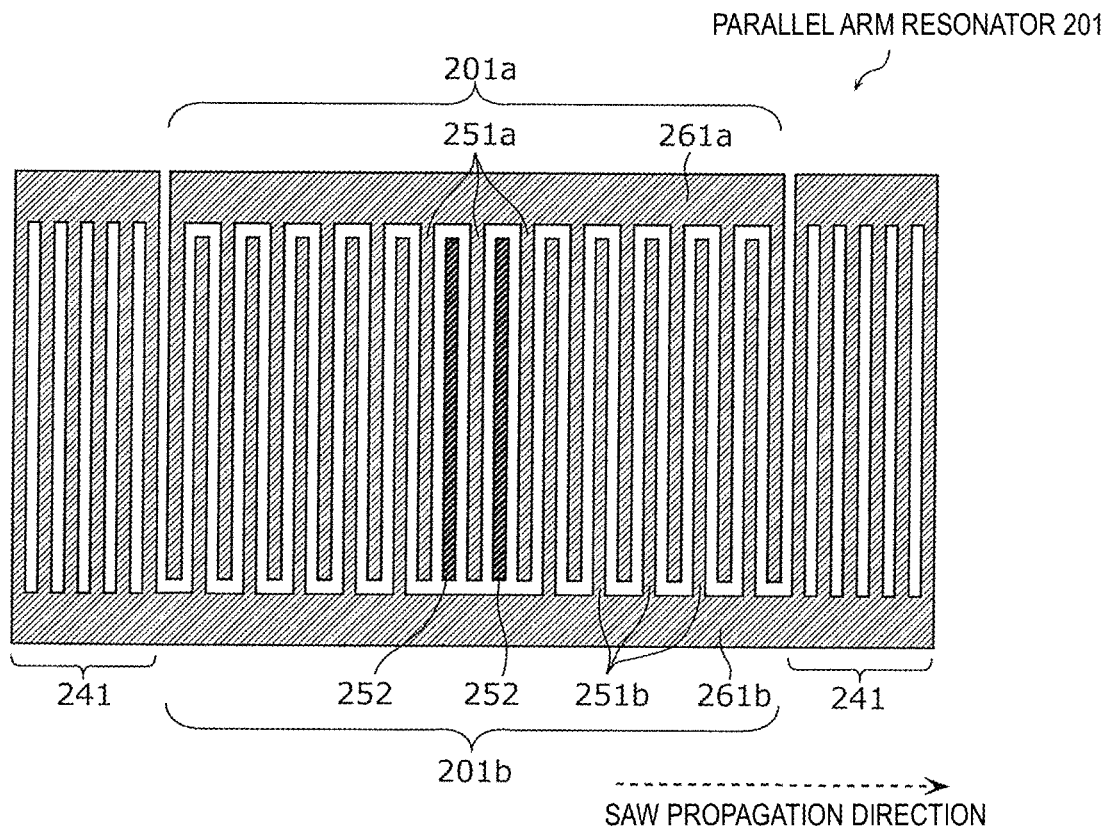
FIG. 5B
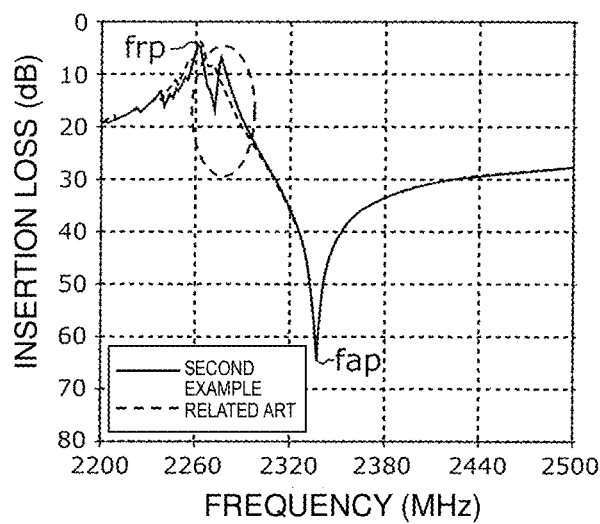

FIG. 6A    FIRST COMPARATIVE EXAMPLE (ACOUSTIC WAVE FILTER 500A)
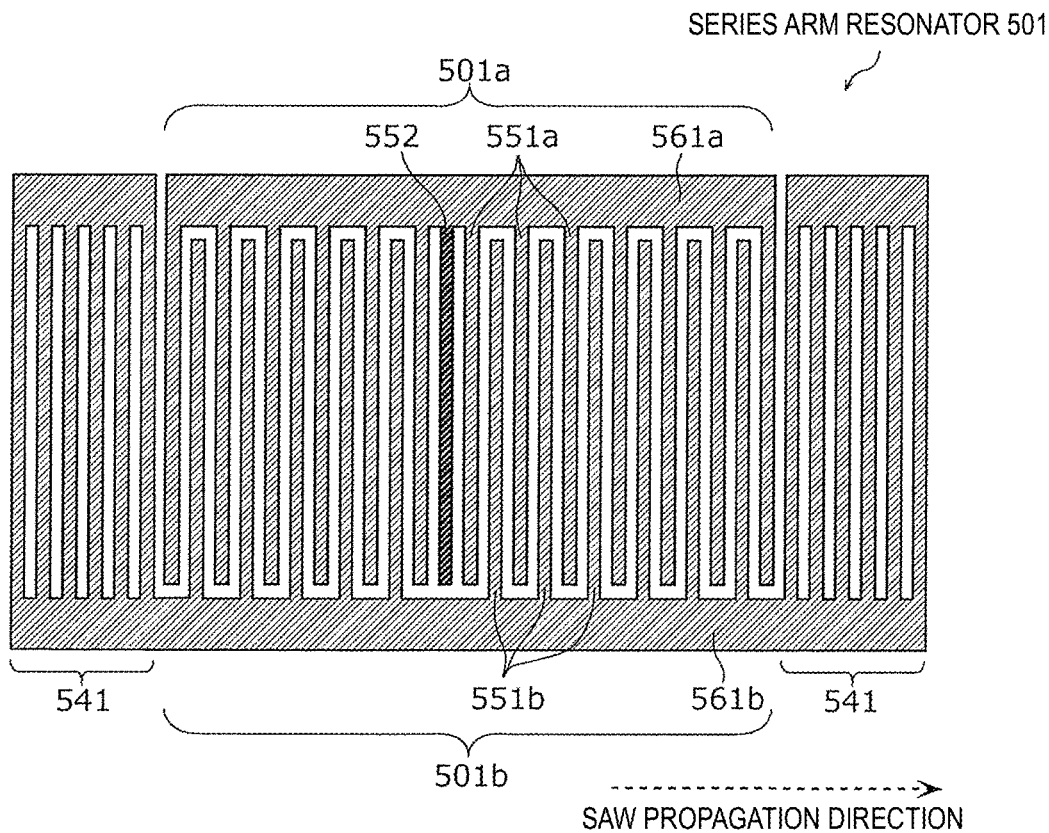
FIG. 6B
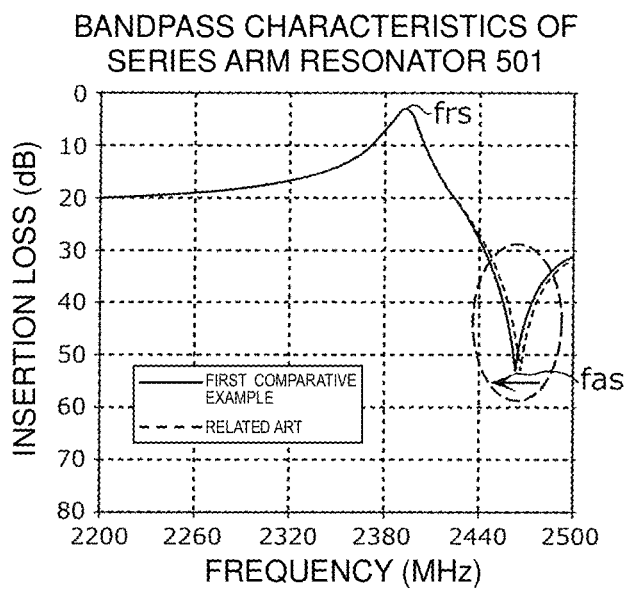

FIG. 7A  SECOND COMPARATIVE EXAMPLE (ACOUSTIC WAVE FILTER 500B)
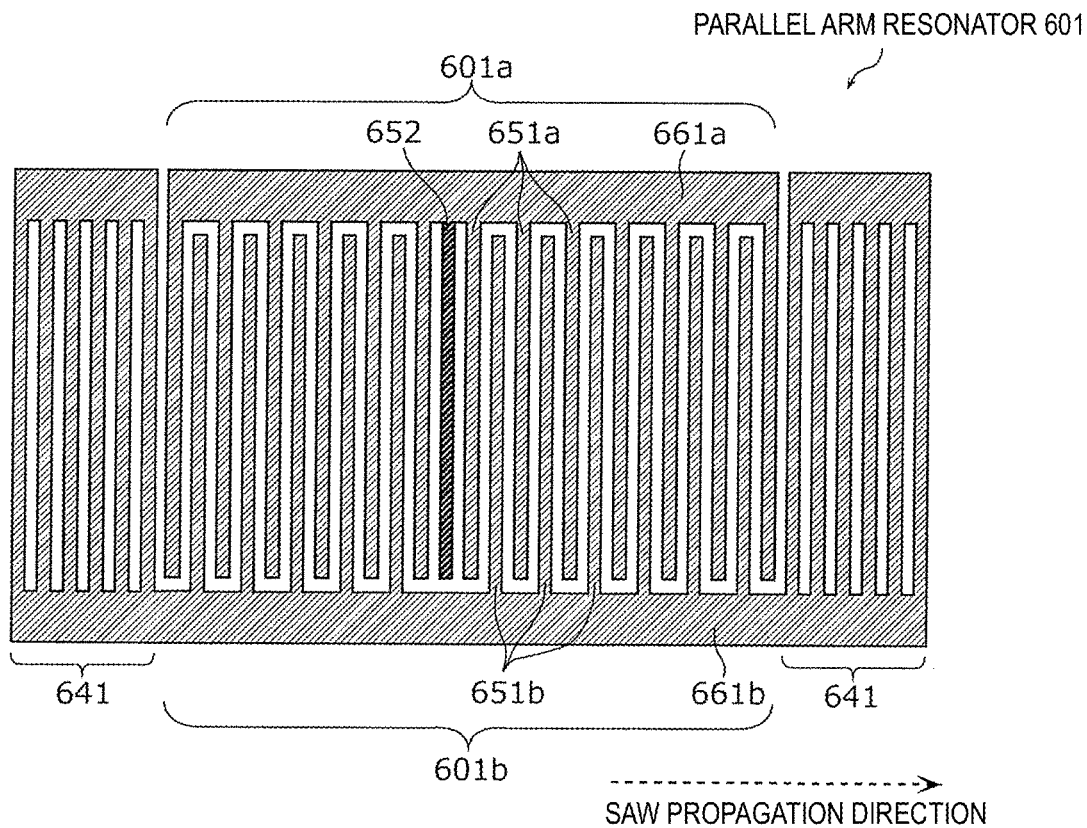
FIG. 7B  BANDPASS CHARACTERISTICS OF PARALLEL ARM RESONATOR 601
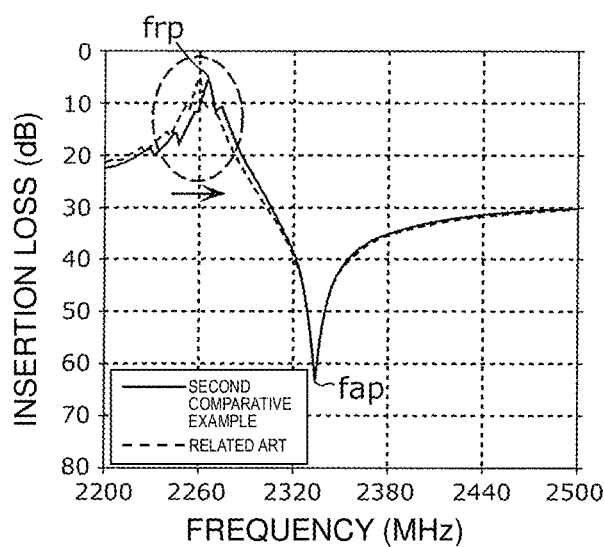

FIG. 8A    THIRD EXAMPLE (ACOUSTIC WAVE FILTER 10C)
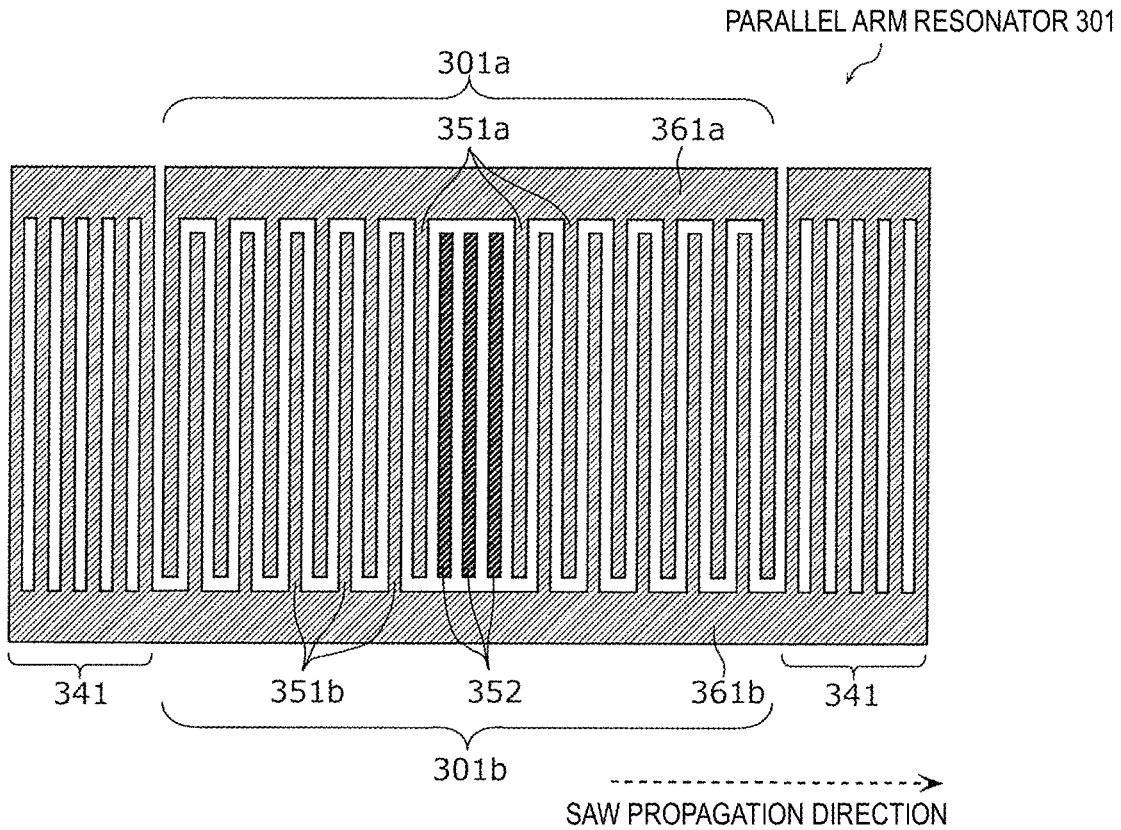
FIG. 8B
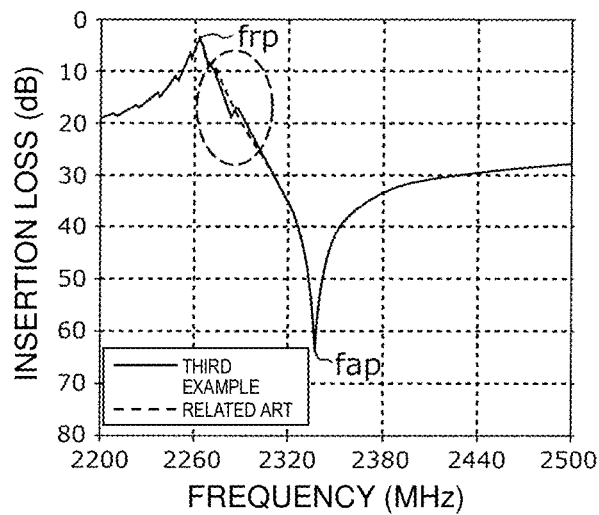

FIG. 9A  FOURTH EXAMPLE (ACOUSTIC WAVE FILTER 10D)
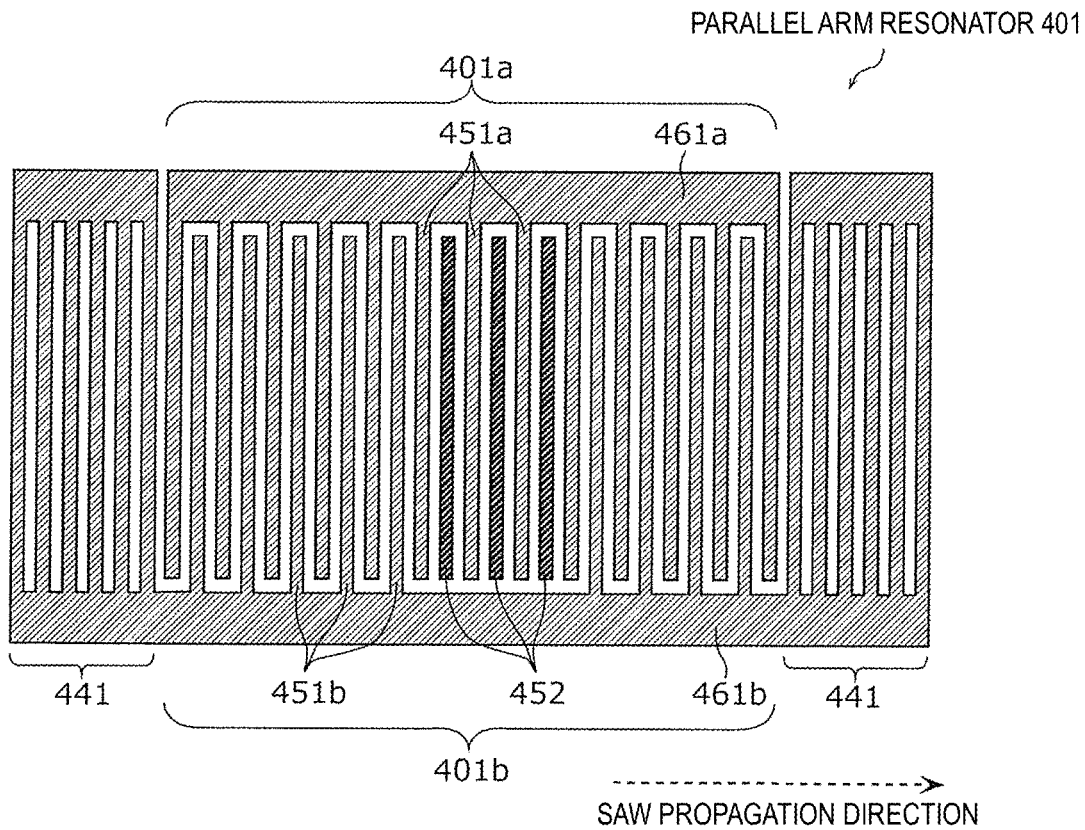
FIG. 9B
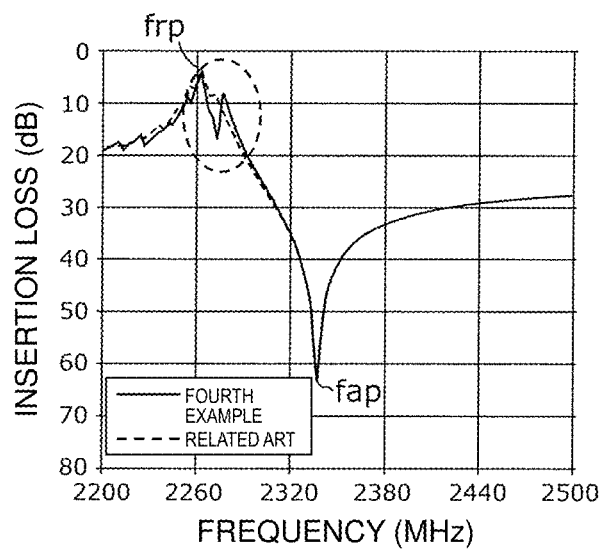

ACOUSTIC WAVE FILTER

CROSS REFERENCE TO RELATED APPLICATIONS

This application claims the benefit of priority to Japanese Patent Application No. 2019-014377 filed on Jan. 30, 2019. The entire contents of this application are hereby incorporated herein by reference.

BACKGROUND OF THE INVENTION

1. Field of the Invention

The present invention relates to an acoustic wave filter including withdrawal-weighted electrodes.

2. Description of the Related Art

A surface acoustic wave (SAW) filter has been put to practical use as a band pass filter used in a radio-frequency (RF) circuit, such as a communication device. For the effective use of the frequency resources for radio communication, many frequency bands are allocated to communication bands for cellular phones, for example, and the interval between adjacent frequency bands is accordingly becoming narrower. In view of this situation of frequency band allocation, the rate of change in the insertion loss in a range from the lower-frequency side of the pass band to the attenuation band (hereinafter called the sharpness at the low-frequency edge of the pass band) and the rate of change in the insertion loss in a range from the higher-frequency side of the pass band to the attenuation band (hereinafter called the sharpness at the high-frequency edge of the pass band) are significant design parameters for SAW filters.

Japanese Unexamined Patent Application Publication No. 2004-23611 discloses a ladder SAW filter having the following withdrawal-weighted configuration. The SAW filter is defined by series arm resonators and parallel arm resonators. To enhance the sharpness at the high-frequency edge or the low-frequency edge of the pass band, some electrode fingers of the interdigital transducer (IDT) electrodes of all the series arm resonators or all the parallel arm resonators are subjected to withdrawal weighting at predetermined intervals.

In the above-described withdrawal-weighted configuration, however, although the sharpness at the high-frequency edge or the low-frequency edge of the pass band is enhanced, the fractional band width of the acoustic wave resonators is decreased. It is thus difficult to enhance the sharpness at an edge of the pass band and also to maintain the pass band width.

SUMMARY OF THE INVENTION

Preferred embodiments of the present invention provide acoustic wave filters that each include series arm resonators and parallel arm resonators to improve sharpness at an edge of a pass band while maintaining a pass band width.

An acoustic wave filter according to a preferred embodiment of the present invention includes at least one series arm resonator disposed on a path connecting two input/output terminals. Each of the at least one series arm resonator is an acoustic wave resonator including an interdigital transducer (IDT) electrode provided on a substrate having piezoelectricity. The resonant frequency of the at least one series arm resonator is positioned within the pass band of the acoustic wave filter. The IDT electrode includes a pair of comb-shaped electrodes. Each of the comb-shaped electrodes includes plural electrode fingers and a busbar electrode. The plural electrode fingers extend in a direction intersecting a propagation direction of acoustic waves and are disposed in parallel or substantially in parallel with each other. One end of an electrode finger and one end of another electrode finger are connected with each other by the busbar electrode. Among the plural electrode fingers, an electrode finger which is connected to neither of the busbar electrodes is defined as a withdrawal-weighting floating electrode. Among the at least one series arm resonator, a series arm resonator having the lowest anti-resonant frequency is a first series arm resonator. The IDT electrode of the first series arm resonator includes two or more of the withdrawal-weighting floating electrode. The two or more of the withdrawal-weighting floating electrode are disposed without any of the electrode fingers of one of the comb-shaped electrodes interposed therebetween.

Acoustic wave filters according to preferred embodiments of the present invention are each able to improve the sharpness at an edge of the pass band while maintaining the pass band width.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a schematic plan view illustrating an example of the configuration of an interdigital transducer (IDT) electrode of a first series arm resonator of an acoustic wave filter according to a first example of a preferred embodiment of the present invention.

FIG. 4B is a graph illustrating the resonance characteristics of the first series arm resonator of the acoustic wave filter of the first example in comparison with those of the related art.

FIG. 5A is a schematic plan view illustrating an example of the configuration of an IDT electrode of a first parallel arm resonator of an acoustic wave filter according to a second example of a preferred embodiment of the present invention.

FIG. 5B is a graph illustrating the resonance characteristics of the first parallel arm resonator of the acoustic wave filter of the second example in comparison with those of the related art.

FIG. 6A is a schematic plan view illustrating an example of the configuration of an IDT electrode of a series arm resonator forming an acoustic wave filter according to a first comparative example.

FIG. 6B is a graph illustrating the resonance characteristics of the series arm resonator of the acoustic wave filter of the first comparative example in comparison with those of the related art.

FIG. 7A is a schematic plan view illustrating an example of the configuration of an IDT electrode of a parallel arm resonator of an acoustic wave filter according to a second comparative example.

FIG. 7B is a graph illustrating the resonance characteristics of the parallel arm resonator of the acoustic wave filter of the second comparative example in comparison with those of the related art.

FIG. 8A is a schematic plan view illustrating an example of the configuration of an IDT electrode of a first parallel arm resonator of an acoustic wave filter according to a third example of a preferred embodiment of the present invention.

FIG. 8B is a graph illustrating the resonance characteristics of the first parallel arm resonator of the acoustic wave filter of the third example in comparison with those of the related art.

FIG. 9A is a schematic plan view illustrating an example of the configuration of an IDT electrode of a first parallel arm resonator of an acoustic wave filter according to a fourth example of a preferred embodiment of the present invention.

FIG. 9B is a graph illustrating the resonance characteristics of the first parallel arm resonator of the acoustic wave filter of the fourth example in comparison with those of the related art.

DETAILED DESCRIPTION OF THE PREFERRED EMBODIMENTS

Figure 1:
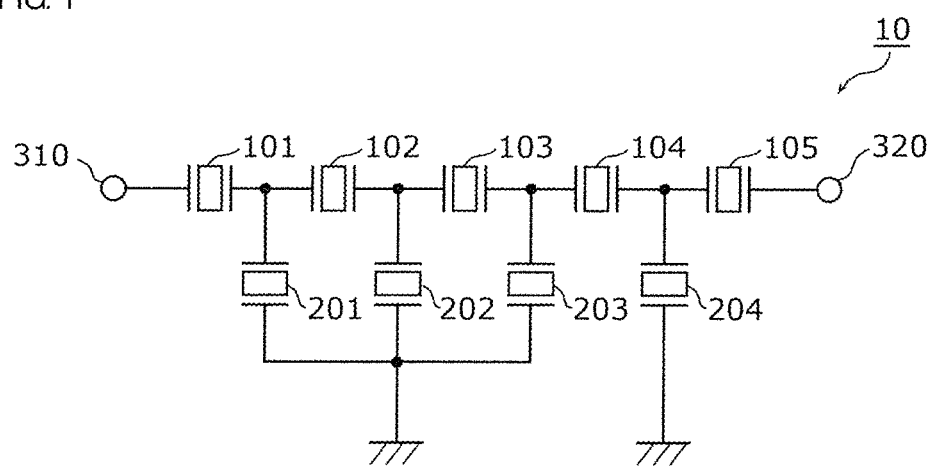
FIG. 1 is a schematic diagram illustrating an example of the circuit configuration of an acoustic wave filter according to a preferred embodiment of the present invention.

Preferred embodiments of the present invention will be described below in detail through illustration of examples and drawings. All of the preferred embodiments described below illustrate general or specific examples. Numeric values, configurations, materials, components, and positions and connection configurations of the components illustrated in the following preferred embodiments are only examples, and are not described to limit the present invention. Among the components illustrated in the following preferred embodiments, the components that are not recited in the independent claims will be described as optional components. The sizes and dimensional ratios of the components in the drawings are not necessarily illustrated as actual sizes and ratios.

Preferred Embodiments

1. Circuit Configuration of Acoustic Wave Filter

FIG. 1 is a schematic diagram illustrating an example of the circuit configuration of an acoustic wave filter 10 according to a preferred embodiment of the present invention. As shown in FIG. 1, the acoustic wave filter 10 includes series arm resonators 101, 102, 103, 104, and 105, parallel arm resonators 201, 202, 203, and 204, and input/output terminals 310 and 320.

The series arm resonators 101 through 105 are disposed on a path connecting the two input/output terminals 310 and 320 and are connected in series with each other. The parallel arm resonators 201 through 204 are disposed between corresponding nodes on the above-described path and corresponding ground terminals. The parallel arm resonators 201 through 203 are connected to the same ground terminal, while the parallel arm resonator 204 is independently connected to a ground terminal. With the configuration in which the series arm resonators 101 through 105 and the parallel arm resonators 201 through 204 are connected in the above-described manner, the acoustic wave filter 10 defines a ladder band pass filter.

The connection mode in which the parallel arm resonators 201 through 204 are connected to ground terminals, that is, whether they are connected to the same ground terminal or individual ground terminals, is not limited to the configuration shown in FIG. 1. The connection configuration may suitably be determined from the viewpoint of adjusting of the attenuation pole of the acoustic wave filter 10.

Although the five series arm resonators 101 through 105 are included in the acoustic wave filter 10 in FIG. 1, at least one series arm resonator is sufficient. Although the four parallel arm resonators 201 through 204 included in the acoustic wave filter 10 in FIG. 1, at least one parallel arm resonator is sufficient.

Circuit elements, such as inductors and capacitors, and a longitudinally coupled resonator may be inserted between the series arm resonators 101 through 105, the parallel arm resonators 201 through 204, and the input/output terminals 310 and 320. In this case, the acoustic wave filter 10 may be defined by the series arm resonator 101 and a longitudinally coupled resonator or by the parallel arm resonator 201 and a longitudinally coupled resonator. That is, it is sufficient if the acoustic wave filter 10 includes at least one or more series arm resonators and/or one or more parallel arm resonators.

The basic structure of a series arm resonator and a parallel arm resonator of the acoustic wave filter 10 will be discussed below.

2. Structure of Acoustic Wave Resonator

Figure 2A:
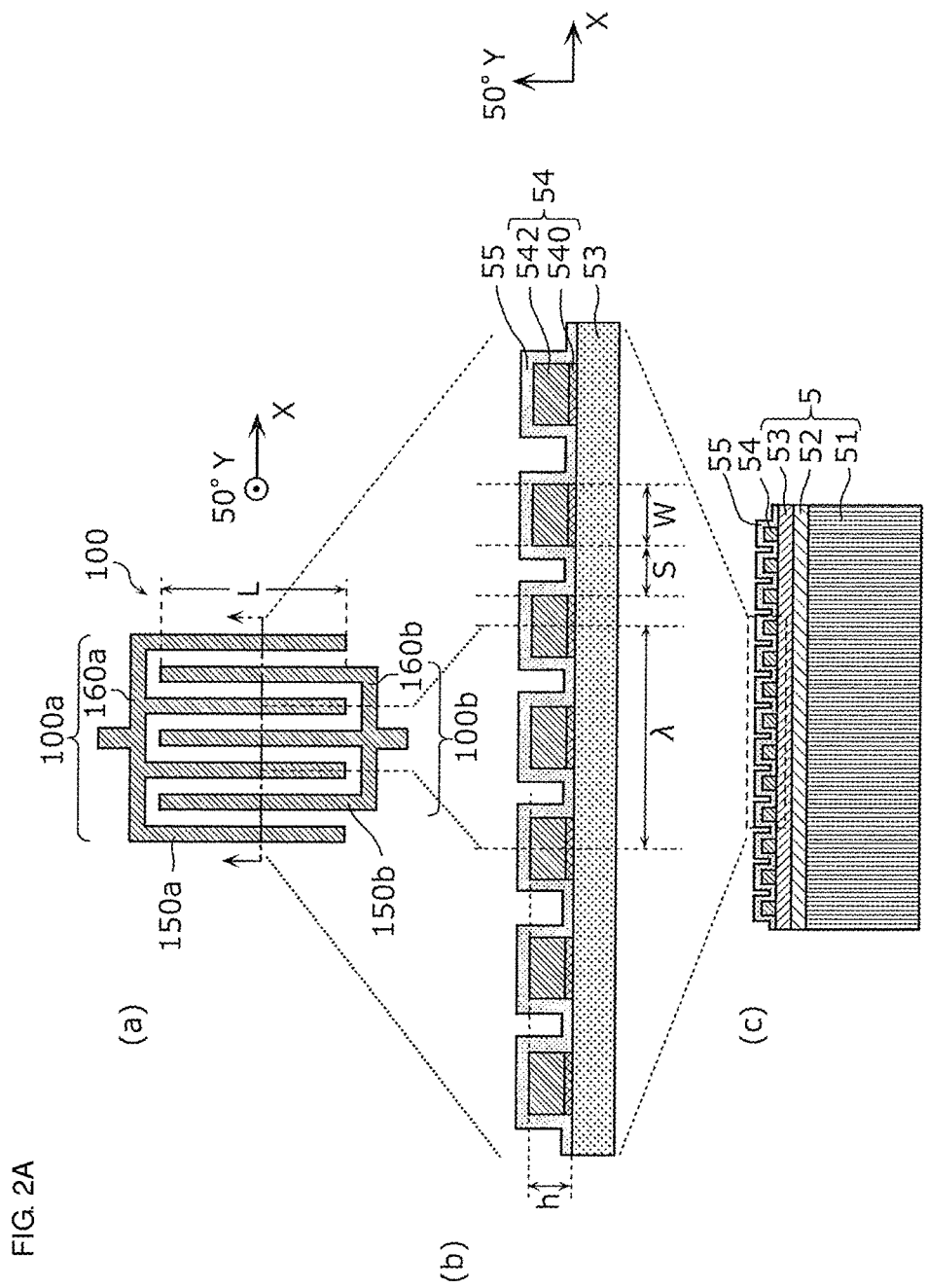
FIG. 2A shows a plan view and sectional views schematically illustrating an example of an acoustic wave resonator used in a preferred embodiment of the present invention.

FIG. 2A is a schematic view illustrating an example of an acoustic wave resonator 100 used in the present preferred embodiment. Part (a) of FIG. 2A is a plan view of the acoustic wave resonator 100, and parts (b) and (c) of FIG. 2A are sectional views taken along the long dashed dotted line in part (a) of FIG. 2A. The acoustic wave resonator 100 represents the basic structure of the series arm resonators 101 through 105 and the parallel arm resonators 201 through 204 of the acoustic wave filter 10. The acoustic wave resonator 100 shown in FIG. 2A is provided merely to explain the typical structure of an acoustic wave resonator, and the number and the length of electrode fingers of an electrode are not restricted to those shown in FIG. 2A.

The acoustic wave resonator 100 includes a substrate 5 having piezoelectricity and a pair of comb-shaped electrodes 100a and 100b.

As shown in FIG. 2A, the pair of comb-shaped electrodes 100a and 100b are provided on the substrate 5 such that they oppose each other. The comb-shaped electrode 100a includes plural electrode fingers 150a and a busbar electrode 160a. The plural electrode fingers 150a are disposed in parallel or substantially in parallel with each other. The busbar electrode 160a connects one end of an electrode finger 150a and one end of another electrode finger 150a with each other. The comb-shaped electrode 100b is defined by plural electrode fingers 150b and a busbar electrode 160b. The plural electrode fingers 150b are disposed in parallel or substantially in parallel with each other. The busbar electrode 160b connects one end of an electrode finger 150b and one end of another electrode finger 150b with each other. The plural electrode fingers 150a and 150b extend in a direction intersecting the propagation direction of acoustic waves (X-axis direction).

An interdigital transducer (IDT) electrode 54 including the plural electrode fingers 150a and 150b and the busbar electrodes 160a and 160b has a multilayer structure including a contact layer 540 and a main electrode layer 542, as shown in FIG. 2A(b).

The contact layer 540 improves the adhesiveness between the substrate 5 and the main electrode layer 542. As the material for the contact layer 540, Ti, for example, is preferably used. The film thickness of the contact layer 540 is preferably about 12 nm, for example.

As the material for the main electrode layer 542, Al with an about 1% Cu content is preferably used, for example. The film thickness of the main electrode layer 542 is preferably about 162 nm, for example.

A protection layer 55 is provided to cover the comb-shaped electrodes 100a and 100b. The protection layer 55 protects the main electrode layer 542 from external environments, adjusts the frequency-temperature characteristics, and improves the moisture resistance. The protection layer 55 is preferably a dielectric film made of silicon dioxide as a main component, for example. The thickness of the protection layer 55 is preferably about 25 nm, for example.

The materials for the contact layer 540, the main electrode layer 542, and the protection layer 55 are not limited to the above-described materials. The IDT electrode 54 is not restricted to the above-described multilayer structure. The IDT electrode 54 may be made of, for example, a metal, such as Ti, Al, Cu, Pt, Au, Ag, or Pd, or an alloy thereof, or may be defined by a multilayer body having multiple layers made of the above-described metals and alloys. The protection layer 55 may include projections and depressions, as shown in part (b) of FIG. 2A, so that the same thickness is maintained for portions with the IDT electrode 54 and for portions without. The protection layer 55 may alternatively have a flat top surface. The protection layer 55 may be omitted.

The multilayer structure of the substrate 5 will be discussed below.

As shown in part (c) of FIG. 2A, the substrate 5 includes a high acoustic velocity support substrate 51, a low acoustic velocity film 52, and a piezoelectric film 53 stacked on each other in this order from the bottom.

The piezoelectric film 53 is preferably made of, for example, a 50°-Y-cut X-propagating LiTaO$_3$ piezoelectric single crystal (assuming that the x axis is the central axis, a lithium tantalite single crystal is cut in cross section normal to the axis rotated by about 50° from the y axis, and surface acoustic waves propagate through this single crystal in the x-axis direction) or piezoelectric ceramics through which surface acoustic waves propagate in the x-axis direction, for example. The thickness of the piezoelectric film 53 is preferably about 600 nm, for example. The material and the cut angle of the piezoelectric single crystal used for the piezoelectric film 53 are suitably selected in accordance with the required specifications of a filter.

The high acoustic velocity support substrate 51 supports the low acoustic velocity film 52, the piezoelectric film 53, and the IDT electrode 54. Through the high acoustic velocity support substrate 51, bulk waves propagate at a higher acoustic velocity than acoustic waves, such as surface acoustic waves and boundary acoustic waves, propagating through the piezoelectric film 53. The high acoustic velocity support substrate 51 traps acoustic waves within the area where the piezoelectric film 53 and the low acoustic velocity film 52 are stacked on each other so as to prevent acoustic waves from leaking downward from the high acoustic velocity support substrate 51. The high acoustic velocity support substrate 51 is preferably a silicon substrate, for example, and has a thickness of about 200 μm, for example.

The low acoustic velocity film 52 is a film through which bulk waves propagate at a lower acoustic velocity than bulk waves propagating through the piezoelectric film 53. The low acoustic velocity film 52 is disposed between the piezoelectric film 53 and the high acoustic velocity support substrate 51. Because of this structure and the properties that acoustic wave energy inherently concentrates on a transmission medium having a low acoustic velocity, a leakage of acoustic wave energy to the outside of the IDT electrode 54 is reduced. The low acoustic velocity film 52 is preferably made of silicon dioxide as a main component, for example, and has a thickness of about 670 nm, for example.

This multilayer structure of the substrate 5 makes it possible to significantly increase the Q factor at the resonant frequency and at the anti-resonant frequency to be higher than that of the structure of the related art in which a piezoelectric substrate has a single layer. That is, this multilayer structure can provide an acoustic wave resonator having a high Q factor. Using such an acoustic wave resonator makes it possible to provide a filter having a small insertion loss.

To improve the sharpness at the high-frequency edge and the low-frequency edge of the pass band of the acoustic wave filter 10, an acoustic wave resonator may include a floating electrode subjected to withdrawal weighting. In this case, however, the Q factor of the acoustic wave resonator may equivalently be decreased depending on the withdrawal ratio, that is, how many electrode fingers are subjected to withdrawal weighting. This will be discussed later. The above-described multilayer structure can maintain the Q factor of the acoustic wave resonator 100 at a high value. The acoustic wave filter 10 is thus able to maintain a small insertion loss within the pass band.

The high acoustic velocity support substrate 51 may have a multilayer structure including a support substrate and a high acoustic velocity film through which bulk waves propagate at a higher acoustic velocity than acoustic waves, such as surface acoustic waves and boundary acoustic waves, propagating through the piezoelectric film 53. In this case, as the support substrate, for example, a piezoelectric substrate made of a substance, such as, sapphire, lithium tantalite, lithium niobate, and crystal; a ceramic substrate made of a substance, such as alumina, magnesia, silicon nitride, aluminum nitride, silicon carbide, zirconia, cordierite, mullite, steatite, and forsterite; a dielectric substrate made of glass, for example; a semiconductor substrate made of a substance, such as silicon and gallium nitride; and a resin substrate may be used. As the high acoustic velocity film, various high acoustic velocity materials, such as aluminum nitride, aluminum oxide, silicon carbide, silicon nitride, silicon oxynitride, a DLC film or diamond, a medium made of any of the above-described materials as a main component, and a medium made of a mixture of the above-described materials as a main component may be used.

Figure 2B:
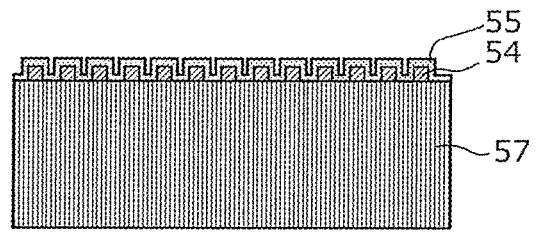
FIG. 2B is a sectional view schematically illustrating an acoustic wave resonator used in a modified example of a preferred embodiment of the present invention.

FIG. 2B is a sectional view schematically illustrating an acoustic wave resonator used in a modified example of the present preferred embodiment. In the acoustic wave resonator 100 shown in FIG. 2A, the IDT electrode 54 is provided on the substrate 5 including the piezoelectric film 53. However, the IDT electrode 54 may be provided on a piezoelectric single crystal substrate 57 including a single piezoelectric layer, as shown in FIG. 2B. The piezoelectric single crystal substrate 57 is preferably made of, for example, a $LiNbO_3$ piezoelectric single crystal. The acoustic wave resonator 100 of the modified example includes the $LiNbO_3$ piezoelectric single crystal substrate 57, the IDT electrode 54, and the protection layer 55 provided on the piezoelectric single crystal substrate 57 and the IDT electrode 54.

The multilayer structure, material, cut angle, and thickness of each of the piezoelectric film 53 and the piezoelectric single crystal substrate 57 may suitably be changed in accordance with the required bandpass characteristics of the acoustic wave filter. An acoustic wave resonator using a $LiTaO_3$ piezoelectric film or substrate having a cut angle other than the above-described cut angle can also obtain advantages similar to those achieved by the acoustic wave resonator 100 using the piezoelectric film 53.

The substrate on which the IDT electrode 54 is provided may have a multilayer structure including a support substrate, an energy trapping layer, and a piezoelectric film stacked on each other in this order from the bottom. The IDT electrode 54 is provided on the piezoelectric film. As the piezoelectric film, a $LiTaO_3$ piezoelectric single crystal or piezoelectric ceramics is used. The support substrate supports the energy trapping layer, the piezoelectric film, and the IDT electrode 54.

The energy trapping layer includes one or multiple layers. The acoustic velocity of acoustic bulk waves propagating through at least one layer of the energy trapping layer is higher than that of acoustic waves propagating through and in the vicinity of the piezoelectric film. The energy trapping layer may have a multilayer structure including a low acoustic velocity layer and a high acoustic velocity layer. The acoustic velocity of bulk waves propagating through the low acoustic velocity layer is lower than that of bulk waves propagating through the piezoelectric film. The acoustic velocity of bulk waves propagating through the high acoustic velocity layer is higher than that of acoustic waves propagating through the piezoelectric film. The support substrate may be formed as a high acoustic velocity layer.

The energy trapping layer may be an acoustic impedance layer defined by relatively low acoustic impedance layers and relatively high acoustic impedance layers alternately stacked on each other.

An example of parameters of the IDT electrode 54 of the acoustic wave resonator 100 will be discussed below.

The wavelength of the acoustic wave resonator 100 is determined by the wavelength λ shown in part (b) of FIG. 2A, which is the repeating period of the plural electrode fingers 150a or 150b of the IDT electrode 54. The electrode pitch is about ½ of the wavelength λ. The electrode pitch is also defined by (W+S) where W indicates the line width of the electrode fingers 150a and 150b forming the comb-shaped electrodes 100a and 100b and S indicates the space width between adjacent electrode fingers 150a and 150b. The intersecting width L of the pair of comb-shaped electrodes 100a and 100b is the length of overlapping electrode fingers 150a and 150b as viewed from the propagation direction of acoustic waves (X-axis direction), as shown in part (a) of FIG. 2A. The electrode duty of the acoustic wave resonator 100 is the ratio of the line width of each of the plural electrode fingers 150a and 150b and is defined by the ratio of the line width to the total width of the line width and the space width of the plural electrode fingers 150a and 150b, that is, the electrode duty is defined by W/(W+S). The height of the comb-shaped electrodes 100a and 100b is represented by h.

3. Operation Principle of Acoustic Wave Filter

The operation principle of a ladder acoustic wave filter according to the present preferred embodiment will be explained below.

Figure 3A:
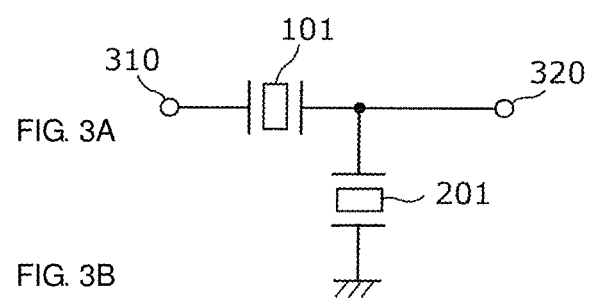
FIG. 3A is a circuit diagram for explaining the operation principle of a ladder acoustic wave filter.
Figure 3B:
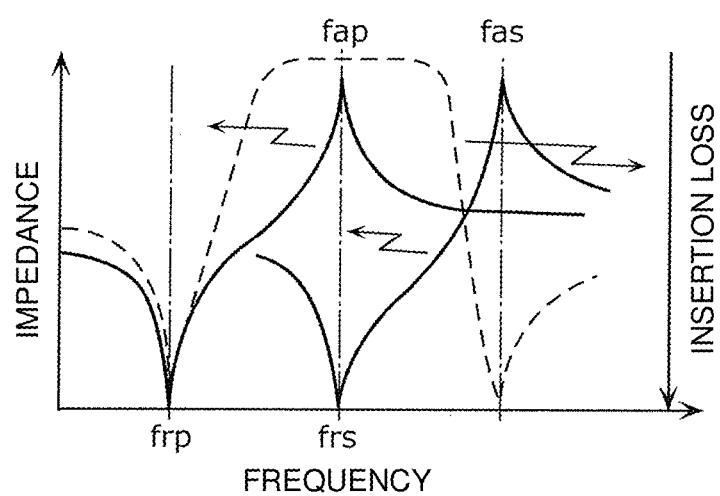
FIG. 3B is a graph illustrating the frequency characteristics of the ladder acoustic wave filter.

FIG. 3A is a diagram for explaining the operation principle of a ladder acoustic wave filter. FIG. 3B is a graph illustrating the frequency characteristics of the ladder acoustic wave filter.

The acoustic wave filter shown in FIG. 3A is a basic ladder filter including one series arm resonator 101 and one parallel arm resonator 201. FIG. 3B shows that the parallel arm resonator 201 has a resonant frequency frp and an anti-resonant frequency fap (>frp) represented by the resonance characteristics and that the series arm resonator 101 has a resonant frequency frs and an anti-resonant frequency fas (>frs>frp) represented by the resonance characteristics.

To provide a band pass filter by using a ladder acoustic wave resonator, the anti-resonant frequency fap of the parallel arm resonator 201 and the resonant frequency frs of the series arm resonator 101 are caused to approach each other. The region at and around the resonant frequency frp where the impedance of the parallel arm resonator 201 approaches 0 defines the lower-frequency stop band. As the frequency increases, the impedance of the parallel arm resonator 201 becomes higher at and around the anti-resonant frequency fap and the impedance of the series arm resonator 101 approaches 0 at and around the resonant frequency frs. The region at and around the anti-resonant frequency fap and the resonant frequency frs defines the pass band in the signal path from the input/output terminal 310 to the input/output terminal 320. As the frequency increases to be even higher, the impedance of the series arm resonator 101 becomes higher at and around the anti-resonant frequency fas, and the region at and around the anti-resonant frequency fas defines the higher-frequency stop band.

The number of resonator stages defined by parallel arm resonators and series arm resonators is optimized in accordance with the required specifications. Typically, if an acoustic wave filter is defined by plural resonator stages, the anti-resonant frequencies fap of the plural parallel arm resonators are set to match or substantially match each other, and the anti-resonant frequencies fas of the plural series arm resonators are set to match or substantially match each other.

In the acoustic wave filter based on the above-described operation principle, when a radio-frequency signal is input from the input/output terminal 310, a potential difference is generated between the input/output terminal 310 and a reference terminal. This causes the piezoelectric layer to distort to generate surface acoustic waves propagating in the X-axis direction. The wavelength λ of the IDT electrode 54 and the wavelength of the pass band are set to match or substantially match each other, thus allowing a radio-frequency signal only having target frequency components to pass through the acoustic wave filter.

If the acoustic wave filter is defined by a longitudinally coupled resonator and a series arm resonator, the resonant frequency frs of the series arm resonator is positioned within the pass band. The impedance of the series arm resonator thus approaches 0 at and around the resonant frequency frs, and the region at and around the resonant frequency frs defines the signal pass band. As the frequency increases, the impedance of the series arm resonator becomes higher at and around the anti-resonant frequency fas, and the region at and around the anti-resonant frequency fas defines the higher-frequency stop band.

If the acoustic wave filter is defined by a longitudinally coupled resonator and a parallel arm resonator, the anti-resonant frequency fap of the parallel arm resonator is positioned within the pass band. The impedance of the parallel arm resonator thus approaches 0 at and around the resonant frequency frp, and the region at and around the resonant frequency frp defines the lower-frequency stop band. The impedance of the parallel arm resonator becomes higher at and around the anti-resonant frequency fap, and the region at and around the anti-resonant frequency fap defines the signal pass band.

4. Electrode Configuration and Bandpass Characteristics of Acoustic Wave Filters According to First and Second Examples The IDT electrode configuration and the bandpass characteristics, which are a distinctive feature of the acoustic wave filter 10 according to the present preferred embodiment, will be discussed below through illustration of the IDT electrode configurations and the bandpass characteristics of acoustic wave filters according to examples of preferred embodiments of the present invention.

FIG. 4A is a schematic plan view illustrating an example of the configuration of the IDT electrode of the series arm resonator 101 of an acoustic wave filter 10A according to a first example of a preferred embodiment of the present invention. The circuit configuration of the acoustic wave filter 10A of the first example is the same or substantially the same as that of the acoustic wave filter 10 of the preferred embodiment shown in FIG. 1. In the first example, the IDT electrode of an acoustic wave resonator has a specific configuration, as shown in FIG. 4A.

In the acoustic wave filter 10A of the first example, a LiNbO$_3$ piezoelectric single crystal is preferably used as a substrate having piezoelectricity, and the LN Rayleigh waves are used as the main mode.

In the acoustic wave filter 10A of the first example, the resonant frequencies frs of the series arm resonators 101 through 105 are positioned within the pass band of the acoustic wave filter 10A. Among the series arm resonators 101 through 105, the series arm resonator 101 is a first series arm resonator having the lowest anti-resonant frequency fas.

In this specification, in the IDT electrode of an acoustic wave resonator, among plural electrode fingers extending in the direction intersecting the propagation direction of acoustic waves, an electrode finger connected to neither of busbar electrodes is defined as a floating electrode subjected to withdrawal weighting (hereinafter called a withdrawal-weighting floating electrode).

As shown in FIG. 4A, the IDT electrode of the series arm resonator 101 includes a pair of comb-shaped electrodes 101a and 101b, two withdrawal-weighting floating electrodes 152, and reflectors 141 disposed at both sides of the pair of comb-shaped electrodes 101a and 101b. The comb-shaped electrode 101a includes plural electrode fingers 151a and a busbar electrode 161a. The plural electrode fingers 151a are disposed in parallel or substantially in parallel with each other. The busbar electrode 161a connects one end of an electrode finger 151a and one end of another electrode finger 151a with each other. The comb-shaped electrode 101b includes plural electrode fingers 151b and a busbar electrode 161b. The plural electrode fingers 151b are disposed in parallel or substantially in parallel with each other.

The busbar electrode 161b connects one end of an electrode finger 151b and one end of another electrode finger 151b with each other.

As shown in FIG. 4A, in the acoustic wave filter 10A of the first example, the IDT electrode of the series arm resonator 101 (first series arm resonator) includes the two withdrawal-weighting floating electrodes 152 which do not sandwich any of the electrode fingers 151b of the comb-shaped electrode 101b but sandwich one electrode finger 151a of the comb-shaped electrode 101a therebetween. The IDT electrodes of the series arm resonators 102 through 105 and the parallel arm resonators 201 through 204 do not include any withdrawal-weighting floating electrodes 152, though they are not shown.

The first series arm resonator having the lowest anti-resonant frequency fas may not necessarily be the series arm resonator 101, and may be one of the series arm resonators 102 through 105. That is, the first series arm resonator may be any series arm resonator regardless of whether or not it is located close to the input/output terminal 310 or 320.

FIG. 4B is a graph illustrating the resonance characteristics of a series arm resonator of the acoustic wave filter of the first example in comparison with those of the related art. More specifically, the resonance characteristics (bandpass characteristics) of the series arm resonator 101 of the acoustic wave filter 10A of the first example and those of a series arm resonator of an acoustic wave filter of the related art are shown in FIG. 4B.

As well as the acoustic wave filter 10A, the acoustic wave filter of the related art has the circuit configuration shown in FIG. 1. In the acoustic wave filter of the related art, however, the series arm resonator having the lowest anti-resonant frequency does not include any withdrawal-weighting floating electrodes or withdrawal-weighting electrodes. That is, none of the series arm resonators and parallel arm resonators have withdrawal-weighting floating electrodes or withdrawal-weighting electrodes.

In the series arm resonator 101 of the acoustic wave filter 10A of the first example, a new mode having a local minimum point and a local maximum point of the insertion loss is generated between the resonant frequency frs and the anti-resonant frequency fas, as indicated by the broken-line elliptical portion in FIG. 4B. The resonant frequency frs and the anti-resonant frequency fas of the series arm resonator 101 roughly match those of the related art.

The reason why the above-described new mode is generated between the resonant frequency frs and the anti-resonant frequency fas in the series arm resonator 101 may be that the IDT electrode of the series arm resonator 101 is divided into two portions at a boundary at which the two withdrawal-weighting floating electrodes 152 are disposed.

Figure 4C:
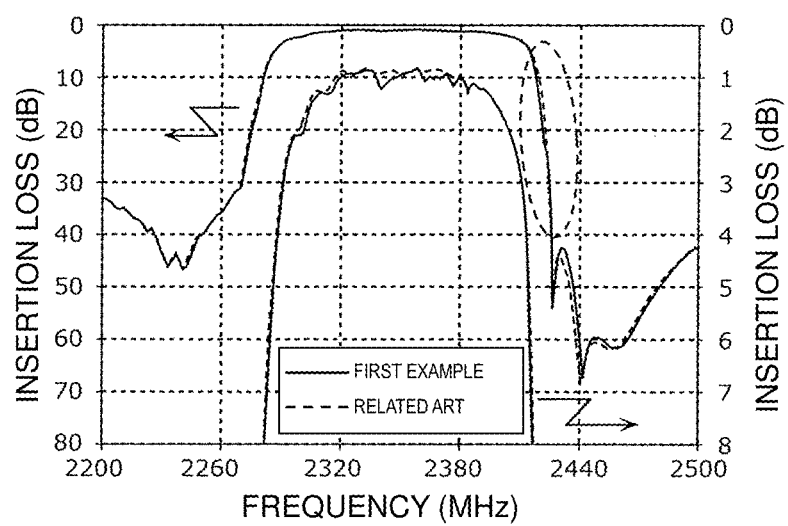
FIG. 4C is a graph illustrating the bandpass characteristics of the acoustic wave filter of the first example in comparison with those of the related art.

FIG. 4C is a graph illustrating the bandpass characteristics of the acoustic wave filter 10A of the first example in comparison with those of the related art. As shown in FIG. 4C, although the insertion loss within the pass band and the sharpness at the low-frequency edge of the pass band of the acoustic wave filter 10A of the first example are similar to those of the related art, the sharpness at the high-frequency edge of the pass band of the acoustic wave filter 10A is improved, as indicated by the broken-line elliptical portion in FIG. 4C.

That is, the acoustic wave filter 10A is able to improve the sharpness at the high-frequency edge of the pass band while maintaining the pass band width.

In the acoustic wave filter 10A of the first example, the two withdrawal-weighting floating electrodes 152 are disposed only in the series arm resonator 101 having the lowest anti-resonant frequency fas. However, the two withdrawal-weighting floating electrodes 152 may be disposed in any of the other series arm resonators 102 through 105.

In the acoustic wave filter 10A of the first example, the two withdrawal-weighting floating electrodes 152 may be disposed asymmetrically with respect to the center of the IDT electrode in the propagation direction of acoustic waves. That is, in FIG. 4A, the number of electrode fingers disposed in the propagation direction of acoustic waves with respect to the two withdrawal-weighting floating electrodes 152 may be different from that of electrode fingers disposed in the direction opposite the propagation direction of acoustic waves with respect to the two withdrawal-weighting floating electrodes 152.

FIG. 5A is a schematic plan view illustrating an example of the configuration of the IDT electrode of the parallel arm resonator 201 on an acoustic wave filter 10B according to a second example according to a preferred embodiment of the present invention. The circuit configuration of the acoustic wave filter 10B of the second example is the same or substantially the same as that of the acoustic wave filter 10 of the preferred embodiment shown in FIG. 1. In the second example, the IDT electrode of an acoustic wave resonator has a specific configuration, as shown in FIG. 5A.

In the acoustic wave filter 10B of the second example, a LiNbO$_3$ piezoelectric single crystal is preferably used as a substrate having piezoelectricity, and the LN Rayleigh waves are used as the main mode.

In the acoustic wave filter 10B of the second example, the anti-resonant frequencies fap of the parallel arm resonators 201 through 204 are positioned within the pass band of the acoustic wave filter 10B. Among the parallel arm resonators 201 through 204, the parallel arm resonator 201 is a first parallel arm resonator having the highest resonant frequency frp.

As shown in FIG. 5A, the IDT electrode of the parallel arm resonator 201 includes a pair of comb-shaped electrodes 201a and 201b, two withdrawal-weighting floating electrodes 252, and reflectors 241 disposed at both sides of the pair of comb-shaped electrodes 201a and 201b. The comb-shaped electrode 201a includes plural electrode fingers 251a and a busbar electrode 261a. The busbar electrode 261a connects one end of an electrode finger 251a and one end of another electrode finger 251a with each other. The comb-shaped electrode 201b includes plural electrode fingers 251b and a busbar electrode 261b. The busbar electrode 261b connects one end of an electrode finger 251b and one end of another electrode finger 251b with each other.

As shown in FIG. 5A, in the acoustic wave filter 10B of the second example, the IDT electrode of the parallel arm resonator 201 (first parallel arm resonator) includes the two withdrawal-weighting floating electrodes 252 which do not sandwich any of the electrode fingers 251b forming the comb-shaped electrode 201b but sandwich one electrode finger 251a forming the comb-shaped electrode 201a therebetween. The IDT electrodes of the series arm resonators 101 through 105 and the parallel arm resonators 202 through 204 do not include any withdrawal-weighting floating electrodes 252, though they are not shown.

The first parallel arm resonator having the highest resonant frequency frp may not necessarily be the parallel arm resonator 201, and may be one of the parallel arm resonators 202 through 204. That is, the first parallel arm resonator may be any parallel arm resonator regardless of whether or not it is located close to the input/output terminal 310 or 320.

FIG. 5B is a graph illustrating the resonance characteristics of a parallel arm resonator of the acoustic wave filter of the second example in comparison with those of the related art. More specifically, the resonance characteristics (bandpass characteristics) of the parallel arm resonator 201 of the acoustic wave filter 10B of the second example and those of a parallel arm resonator of an acoustic wave filter of the related art are shown in FIG. 5B.

As well as the acoustic wave filter 10B, the acoustic wave filter of the related art has the circuit configuration shown in FIG. 1. In the acoustic wave filter of the related art, however, the parallel arm resonator having the highest resonant frequency does not include any withdrawal-weighting floating electrodes or withdrawal-weighting electrodes. That is, none of the parallel arm resonators and series arm resonators have withdrawal-weighting floating electrodes or withdrawal-weighting electrodes.

In the parallel arm resonator 201 of the acoustic wave filter 10B of the second example, a new mode having a local minimum point and a local maximum point of the insertion loss is generated between the resonant frequency frp and the anti-resonant frequency fap, as indicated by the broken-line elliptical portion in FIG. 5B. The resonant frequency frp and the anti-resonant frequency fap of the parallel arm resonator 201 roughly match those of the related art.

The reason why the above-described new mode is generated between the resonant frequency frp and the anti-resonant frequency fap in the parallel arm resonator 201 may be that the IDT electrode of the parallel arm resonator 201 is divided into two portions at a boundary at which the two withdrawal-weighting floating electrodes 252 are disposed.

Figure 5C:
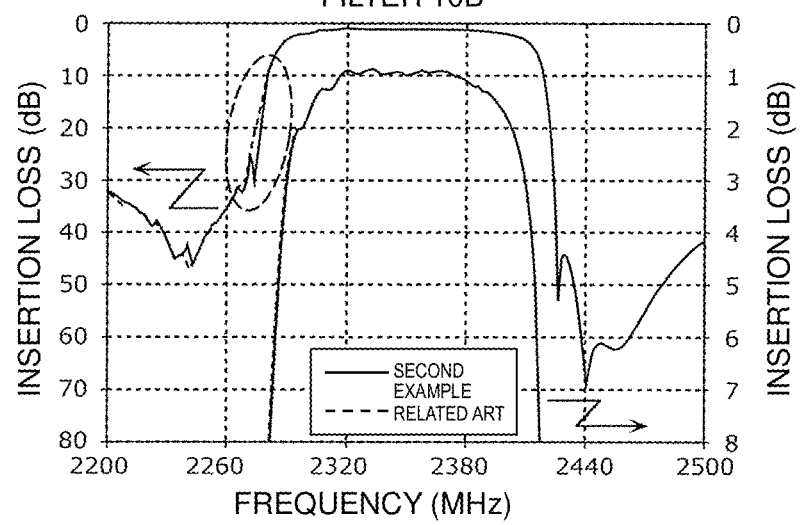
FIG. 5C is a graph illustrating the bandpass characteristics of the acoustic wave filter of the second example in comparison with those of the related art.

FIG. 5C is a graph illustrating the bandpass characteristics of the acoustic wave filter 10B of the second example in comparison with those of the related art. As shown in FIG. 5C, although the insertion loss within the pass band and the sharpness at the high-frequency edge of the pass band of the acoustic wave filter 10B of the second example are similar to those of the related art, the sharpness at the low-frequency edge of the pass band of the acoustic wave filter 10B is improved, as indicated by the broken-line elliptical portion in FIG. 5C.

That is, the acoustic wave filter 10B is able to improve the sharpness at the low-frequency edge of the pass band while maintaining the pass band width.

In the acoustic wave filter 10B of the second example, the two withdrawal-weighting floating electrodes 252 are disposed only in the parallel arm resonator 201 having the highest resonant frequency frp. However, the two withdrawal-weighting floating electrodes 252 may also be disposed in any of the other parallel arm resonators 202 through 204.

In the acoustic wave filter 10B of the second example, the two withdrawal-weighting floating electrodes 252 may be disposed asymmetrically with respect to the center of the IDT electrode in the propagation direction of acoustic waves. That is, in FIG. 5A, the number of electrode fingers disposed in the propagation direction of acoustic waves with respect to the two withdrawal-weighting floating electrodes 252 may be different from that of electrode fingers disposed in the direction opposite the propagation direction of acoustic waves with respect to the two withdrawal-weighting floating electrodes 252.

FIG. 6A is a schematic plan view illustrating an example of the configuration of the IDT electrode of a series arm resonator 501 defining an acoustic wave filter 500A according to a first comparative example. Among series arm resonators, the series arm resonator 501 has the lowest anti-resonant frequency fas. The configuration of the IDT electrode of the series arm resonator 501 of the acoustic wave filter 500A is different from that of the series arm resonator 101 of the acoustic wave filter 10A of the first example. The acoustic wave filter 500A of the first comparative example includes series arm resonators 501, 102, 103, 104, and 105, parallel arm resonators 201, 202, 203, and 204, and input/output terminals 310 and 320.

In the acoustic wave filter 500A of the first comparative example, the resonant frequencies frs of the series arm resonators 501 and 102 through 105 and the anti-resonant frequencies fap of the parallel arm resonators 201 through 204 are positioned within the pass band of the acoustic wave filter 500A. Among the series arm resonators 501 and 102 through 105, the series arm resonator 501 is an acoustic wave resonator having the lowest anti-resonant frequency fas.

As shown in FIG. 6A, the IDT electrode of the series arm resonator 501 includes a pair of comb-shaped electrodes 501a and 501b and reflectors 541 disposed at both sides of the pair of comb-shaped electrodes 501a and 501b. The comb-shaped electrode 501a includes plural electrode fingers 551a, an electrode finger 552, and a busbar electrode 561a. The busbar electrode 561a connects one end of the electrode finger 552 and one end of each of the electrode fingers 551a with each other. The comb-shaped electrode 501b includes plural electrode fingers 551b and a busbar electrode 561b. The busbar electrode 561b connects one end of an electrode finger 551b and one end of another electrode finger 551b with each other. The electrode fingers adjacent to the electrode finger 552 connected to the busbar electrode 561a are also connected to the busbar electrode 561a. According to the arrangement regularity of the electrode fingers, the electrode finger 552 is supposed to be connected to the busbar electrode 561b. The electrode finger 552 is however connected to the busbar electrode 561a. That is, the electrode finger 552 is a withdrawal-weighting electrode, which is eliminated from a group of electrode fingers connected to the busbar electrode 561b based on the arrangement regularity of the electrode fingers. In the acoustic wave filter 500A of the first comparative example, the IDT electrode of the series arm resonator 501 having the lowest anti-resonant frequency fas includes one withdrawal-weighting electrode (electrode finger 552).

The series arm resonator having the lowest anti-resonant frequency fas may not necessarily be the series arm resonator 501, and may be one of the series arm resonators 102 through 105. That is, the series arm resonator having the lowest anti-resonant frequency fas may be any series arm resonator regardless of whether or not it is located close to the input/output terminal 310 or 320.

FIG. 6B is a graph illustrating the resonance characteristics of a series arm resonator of the acoustic wave filter of the first comparative example in comparison with those of the related art. More specifically, the resonance characteristics (bandpass characteristics) of the series arm resonator 501 of the acoustic wave filter 500A of the first comparative example and those of a series arm resonator of an acoustic wave filter of the related art are shown in FIG. 6B.

The acoustic wave filter of the related art has the circuit configuration shown in FIG. 1. In the acoustic wave filter of the related art, however, unlike in the acoustic wave filter 500A, the series arm resonator having the lowest anti-resonant frequency does not include any withdrawal-weighting floating electrodes or withdrawal-weighting electrodes. That is, none of the series arm resonators and parallel arm resonators have withdrawal-weighting floating electrodes or withdrawal-weighting electrodes.

In the series arm resonator 501 of the acoustic wave filter 500A of the first comparative example, although the resonant frequency frs is not shifted from that of the related art, the anti-resonant frequency fas is shifted to the lower-frequency side than that of the related art, as shown in FIG. 6B. Additionally, a new mode between the resonant frequency frs and the anti-resonant frequency fas, which is observed in the series arm resonator 101 of the acoustic wave filter 10A of the first example, is not generated. With only one withdrawal-weighting electrode (electrode finger 552) or only one withdrawal-weighting floating electrode, as in the series arm resonator 501 of the acoustic wave filter 500A of the first comparative example, the above-described new mode is not generated. Even with plural withdrawal-weighting floating electrodes, if an electrode finger of one comb-shaped electrode and an electrode finger of the other comb-shaped electrode are both interposed between two withdrawal-weighting floating electrodes, the above-described new mode is not generated.

Figure 6C:
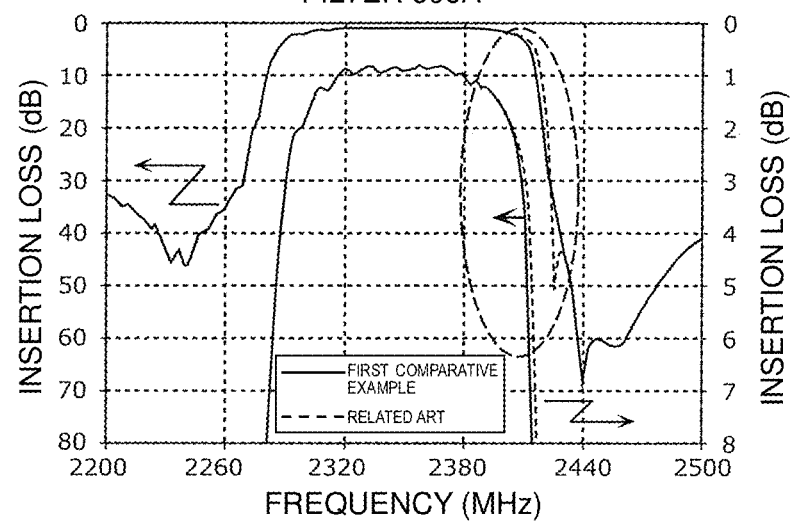
FIG. 6C is a graph illustrating the bandpass characteristics of the acoustic wave filter of the first comparative example in comparison with those of the related art.

FIG. 6C is a graph illustrating the bandpass characteristics of the acoustic wave filter 500A of the first comparative example in comparison with those of the related art. As shown in FIG. 6C, although the sharpness at the low-frequency edge of the pass band of the acoustic wave filter 500A of the first comparative example is similar to that of the related art, the sharpness at the high-frequency edge of the pass band of the acoustic wave filter 500A is enhanced, as indicated by the broken-line elliptical portion in FIG. 6C. On the other hand, however, the insertion loss at the high-frequency edge of the pass band is increased, as indicated by the broken-line elliptical portion in FIG. 6C. The reason for this may be as follows. To improve the sharpness at the high-frequency edge of the pass band, one withdrawal-weighting electrode (electrode finger 552) is disposed in the IDT electrode of the series arm resonator 501. This configuration decreases the interval (fractional band width) between the resonant frequency frs and the anti-resonant frequency fas.

In contrast, in the acoustic wave filter 10A of the first example, to improve the sharpness at the high-frequency edge of the pass band, the two withdrawal-weighting floating electrodes 152 are disposed in the IDT electrode of the series arm resonator 101. This configuration does not decrease the interval (fractional band width) between the resonant frequency frs and the anti-resonant frequency fas. Thus, the pass band width of the acoustic wave filter 10A does not become narrower. The sharpness at the high-frequency edge of the pass band is improved due to the new mode generated between the resonant frequency frs and the anti-resonant frequency fas of the series arm resonator 101.

FIG. 7A is a schematic plan view illustrating an example of the configuration of the IDT electrode of a parallel arm resonator 601 forming an acoustic wave filter 500B according to a second comparative example. Among parallel arm resonators, the parallel arm resonator 601 has the highest resonant frequency frp. The configuration of the IDT electrode of the parallel arm resonator 601 of the acoustic wave filter 500B is different from that of the parallel arm resonator 201 of the acoustic wave filter 10B of the second example. The acoustic wave filter 500B of the second comparative example includes series arm resonators 101, 102, 103, 104, and 105, parallel arm resonators 601, 202, 203, and 204, and input/output terminals 310 and 320.

In the acoustic wave resonator 500B of the second comparative example, the resonant frequencies frs of the series arm resonators 101 through 105 and the anti-resonant frequencies fap of the parallel arm resonators 601 and 202 through 204 are positioned within the pass band of the acoustic wave filter 500B. Among the parallel arm resonators 601 and 202 through 204, the parallel arm resonator 601 is an acoustic wave resonator having the highest resonant frequency frp.

As shown in FIG. 7A, the IDT electrode of the parallel arm resonator 601 includes a pair of comb-shaped electrodes 601a and 601b and reflectors 641 disposed at both sides of the pair of comb-shaped electrodes 601a and 601b. The comb-shaped electrode 601a includes plural electrode fingers 651a, an electrode finger 652, and a busbar electrode 661a. The busbar electrode 661a connects one end of the electrode finger 652 and one end of each of the electrode fingers 651a with each other. The comb-shaped electrode 601b includes plural electrode fingers 651b and a busbar electrode 661b. The busbar electrode 661b connects one end of an electrode finger 651b and one end of another electrode finger 651b with each other. The electrode fingers adjacent to the electrode finger 652 connected to the busbar electrode 661a are also connected to the busbar electrode 661a. According to the arrangement regularity of the electrode fingers, the electrode finger 652 is supposed to be connected to the busbar electrode 661b. The electrode finger 652 is however connected to the busbar electrode 661a. That is, the electrode finger 652 is a withdrawal-weighting electrode, which is eliminated from a group of electrode fingers connected to the busbar electrode 661b based on the arrangement regularity of the electrode fingers. In the acoustic wave filter 500B of the second comparative example, the IDT electrode of the parallel arm resonator 601 having the highest resonant frequency frp includes one withdrawal-weighting electrode (electrode finger 652).

The parallel arm resonator having the highest resonant frequency frp may not necessarily be the parallel arm resonator 601, and may be one of the parallel arm resonators 202 through 204. That is, the parallel arm resonator having the highest resonant frequency frp may be any parallel arm resonator regardless of whether or not it is located close to the input/output terminal 310 or 320.

FIG. 7B is a graph illustrating the resonance characteristics of a parallel arm resonator of the acoustic wave filter of the second comparative example in comparison with those of the related art. More specifically, the resonance characteristics (bandpass characteristics) of the parallel arm resonator 601 of the acoustic wave filter 500B of the second comparative example and those of a parallel arm resonator of an acoustic wave filter of the related art are shown in FIG. 7B.

The acoustic wave filter of the related art has the circuit configuration shown in FIG. 1. In the acoustic wave filter of the related art, however, unlike in the acoustic wave filter 500B, the parallel arm resonator having the highest resonant frequency does not include any withdrawal-weighting floating electrodes or withdrawal-weighting electrodes. That is, none of the series arm resonators and parallel arm resonators have withdrawal-weighting floating electrodes or withdrawal-weighting electrodes.

In the parallel arm resonator 601 of the acoustic wave filter 500B of the second comparative example, the resonant frequency frp is shifted to the higher-frequency side than that of the related art.

Figure 7C:
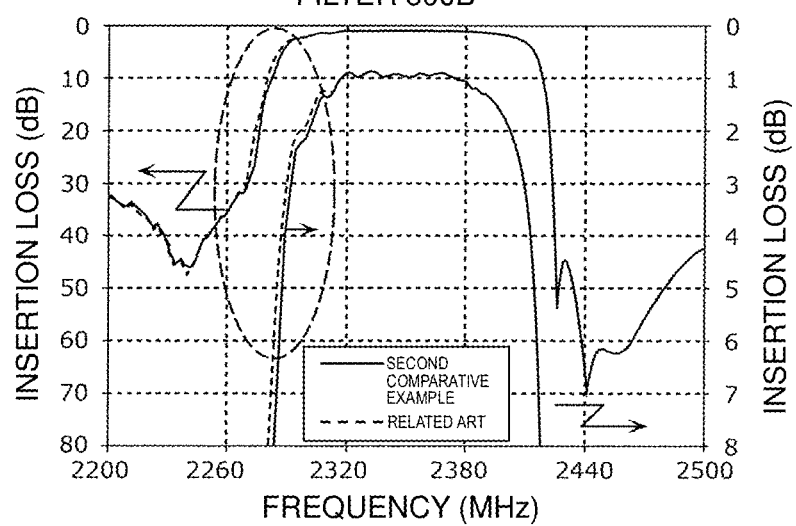
FIG. 7C is a graph illustrating the bandpass characteristics of the acoustic wave filter of the second comparative example in comparison with those of the related art.

FIG. 7C is a graph illustrating the bandpass characteristics of the acoustic wave filter 500B of the second comparative example in comparison with those of the related art. As shown in FIG. 7C, although the sharpness at the high-frequency edge of the pass band of the acoustic wave filter 500B of the second comparative example is similar to that of the related art, the sharpness at the low-frequency edge of the pass band of the acoustic wave filter 500B is improved, as indicated by the broken-line elliptical portion in FIG. 7C. On the other hand, however, the insertion loss at the low-frequency edge of the pass band is increased, as indicated by the broken-line elliptical portion in FIG. 7C. The reason for this may be as follows. To improve the sharpness at the low-frequency edge of the pass band, one withdrawal-weighting electrode (electrode finger 652) is disposed in the IDT electrode of the parallel arm resonator 601. This configuration decreases the interval (fractional band width) between the resonant frequency frp and the anti-resonant frequency fap.

In contrast, in the acoustic wave filter 10B of the second example, to improve the sharpness at the low-frequency edge of the pass band, the two withdrawal-weighting floating electrodes 252 are disposed in the IDT electrode of the parallel arm resonator 201. This configuration does not decrease the interval (fractional band width) between the resonant frequency frp and the anti-resonant frequency fap of the parallel arm resonator 201. Thus, the pass band width of the acoustic wave filter 10B does not become narrower. The sharpness at the low-frequency edge of the pass band is improved due to the new mode generated between the resonant frequency frp and the anti-resonant frequency fap of the parallel arm resonator 201.

The acoustic wave filter 10A according to the first example includes one or more series arm resonators 101 through 105 disposed on a path connecting the two input/output terminals 310 and 320. Each of the series arm resonators 101 through 105 is an acoustic wave resonator including an IDT electrode provided on a substrate having piezoelectricity. The resonant frequencies frs of the series arm resonators 101 through 105 are positioned within the pass band of the acoustic wave filter 10A. The IDT electrode includes a pair of comb-shaped electrodes. Each of the comb-shaped electrodes includes plural electrode fingers and a busbar electrode. The plural electrode fingers extend in a direction intersecting the propagation direction of acoustic waves and are disposed in parallel or substantially in parallel with each other. The busbar electrode connects one end of an electrode finger and one end of another electrode finger with each other. Among the series arm resonators 101 through 105, the series arm resonator 101 has the lowest anti-resonant frequency fas. The IDT electrode of the series arm resonator 101 includes two or more withdrawal-weighting floating electrodes which are disposed without having any of the electrode fingers of the comb-shaped electrodes interposed therebetween.

With this configuration, because of the two withdrawal-weighting floating electrodes disposed in the IDT electrode of the series arm resonator 101, a new resonant mode is generated between the resonant frequency and the anti-resonant frequency of the series arm resonator 101 without decreasing the interval between the resonant frequency and the anti-resonant frequency, that is, without making the fractional band width of the series arm resonator 101 smaller. It is thus possible to improve the sharpness at the high-frequency edge of the pass band without making the pass band width of the acoustic wave filter narrower. That is, it is possible to improve the sharpness at the high-frequency edge of the pass band while maintaining the pass band width.

The acoustic wave filter 10B according to the second example includes one or more parallel arm resonators 201 through 204 disposed between a ground and a path connecting the two input/output terminals 310 and 320. Each of the parallel arm resonators 201 through 204 is an acoustic wave resonator including an IDT electrode provided on a substrate having piezoelectricity. The anti-resonant frequencies fap of the parallel arm resonators 201 through 204 are positioned within the pass band of the acoustic wave filter 10B. The IDT electrode includes a pair of comb-shaped electrodes. Each of the comb-shaped electrodes includes plural electrode fingers and a busbar electrode. The plural electrode fingers extend in a direction intersecting the propagation direction of acoustic waves and are disposed in parallel or substantially in parallel with each other. The busbar electrode connects one end of an electrode finger and one end of another electrode finger with each other. Among the parallel arm resonators 201 through 204, the parallel arm resonator 201 has the highest resonant frequency frp. The IDT electrode of the parallel arm resonator 201 includes two or more withdrawal-weighting floating electrodes which are disposed without having any of the electrode fingers forming one of the comb-shaped electrodes interposed therebetween.

With this configuration, because of the two withdrawal-weighting floating electrodes disposed in the IDT electrode of the parallel arm resonator 201, a new resonant mode is generated between the resonant frequency and the anti-resonant frequency of the parallel arm resonator 201 without decreasing the interval between the resonant frequency and the anti-resonant frequency, that is, without making the fractional band width of the parallel arm resonator 201 smaller. It is thus possible to improve the sharpness at the low-frequency edge of the pass band without making the pass band width of the acoustic wave filter narrower. That is, it is possible to improve the sharpness at the low-frequency edge of the pass band while maintaining the pass band width.

In the acoustic wave filters of the first and second examples, the above-described two withdrawal-weighting floating electrodes are disposed in the IDT electrode of only one of a series arm resonator and a parallel arm resonator. In an acoustic wave filter according to a preferred embodiment of the present invention, however, the above-described two withdrawal-weighting floating electrodes may be disposed both in the IDT electrode of a series arm resonator and that of a parallel arm resonator.

With this configuration, because of the two withdrawal-weighting floating electrodes disposed in each of the IDT electrode of a series arm resonator and that of a parallel arm resonator, a new resonant mode is generated between the resonant frequency and the anti-resonant frequency of the series arm resonator and that of the parallel arm resonator without decreasing the interval between the resonant frequency and the anti-resonant frequency. It is thus possible to improve the sharpness at the high-frequency edge and the low-frequency edge of the pass band without making the pass band width of the acoustic wave filter narrower.

5. Electrode Configuration and Bandpass Characteristics of Acoustic Wave Filters According to Third and Fourth Examples FIG. 8A is a schematic plan view illustrating an example of the configuration of the IDT electrode of a parallel arm resonator 301 forming an acoustic wave filter 10C according to a third example of a preferred embodiment of the present invention. The acoustic wave filter 10C of the third example is different from the acoustic wave filter 10B of the second example in the configuration of the IDT electrode of the parallel arm resonator 301 having the highest resonant frequency frp. That is, the acoustic wave filter 10C of the third example includes series arm resonators 101, 102, 103, 104, and 105, parallel arm resonators 301, 202, 203, and 204, and input/output terminals 310 and 320.

In the acoustic wave filter 10C of the third example, the anti-resonant frequencies fap of the parallel arm resonators 301 and 202 through 204 are positioned within the pass band of the acoustic wave filter 10C. Among the parallel arm resonators 301 and 202 through 204, the parallel arm resonator 301 is an acoustic wave resonator having the highest resonant frequency frp.

As shown in FIG. 8A, the IDT electrode of the parallel arm resonator 301 includes a pair of comb-shaped electrodes 301a and 301b, three withdrawal-weighting floating electrodes 352, and reflectors 341 disposed at both sides of the pair of comb-shaped electrodes 301a and 301b. The comb-shaped electrode 301a includes plural electrode fingers 351a and a busbar electrode 361a. The busbar electrode 361a connects one end of an electrode finger 351a and one end of another electrode finger 351a with each other. The comb-shaped electrode 301b includes plural electrode fingers 351b and a busbar electrode 361b. The busbar electrode 361b connects one end of an electrode finger 351b and one end of another electrode finger 351b with each other.

As shown in FIG. 8A, in the acoustic wave filter 10C of the third example, the IDT electrode of the parallel arm resonator 301 (first parallel arm resonator) includes the three withdrawal-weighting floating electrodes 352 which are continuously disposed without sandwiching any of the electrode fingers 351b of the comb-shaped electrode 301b or any of the electrode fingers 351a of the comb-shaped electrode 301a therebetween. The IDT electrodes of the series arm resonators 101 through 105 and the parallel arm resonators 202 through 204 do not include any withdrawal-weighting floating electrodes 352, though they are not shown.

The parallel arm resonator having the highest resonant frequency frp may not necessarily be the parallel arm resonator 301, and may be one of the parallel arm resonators 202 through 204. That is, the parallel arm resonator having the highest resonant frequency frp may be any parallel arm resonator regardless of whether or not it is located close to the input/output terminal 310 or 320.

FIG. 8B is a graph illustrating the resonance characteristics of a parallel arm resonator of the acoustic wave filter of the third example in comparison with those of the related art. More specifically, the resonance characteristics (bandpass characteristics) of the parallel arm resonator 301 of the acoustic wave filter 10C of the third example and those of a parallel arm resonator of an acoustic wave filter of the related art are shown in FIG. 8B.

The acoustic wave filter of the related art has the circuit configuration shown in FIG. 1. In the acoustic wave filter of the related art, however, unlike in the acoustic wave filter 10C, the parallel arm resonator having the highest resonant frequency does not include any withdrawal-weighting floating electrodes or withdrawal-weighting electrodes. That is, none of the parallel arm resonators and series arm resonators have withdrawal-weighting floating electrodes or withdrawal-weighting electrodes.

In the parallel arm resonator 301 of the acoustic wave filter 10C of the third example, a new mode having a local minimum point and a local maximum point of the insertion loss is generated between the resonant frequency frp and the anti-resonant frequency fap, as indicated by the broken-line elliptical portion in FIG. 8B. The resonant frequency frp and the anti-resonant frequency fap of the parallel arm resonator 301 roughly match those of the related art. The acoustic wave filter 10C is therefore able to improve the sharpness at the low-frequency edge of the pass band while maintaining the pass band width.

The reason why the above-described new mode is generated between the resonant frequency frp and the anti-resonant frequency fap in the parallel arm resonator 301 may be that the IDT electrode of the parallel arm resonator 301 is divided into two portions at a boundary at which the three continuous withdrawal-weighting floating electrodes 352 are disposed.

In the acoustic wave filter 10C of the third example, the three continuous withdrawal-weighting floating electrodes 352 are disposed only in the parallel arm resonator 301 having the highest resonant frequency frp. However, the three continuous withdrawal-weighting floating electrodes 352 may also be disposed in any of the other parallel arm resonators 202 through 204.

Instead of the three continuous withdrawal-weighting floating electrodes 352, two or four or more continuous withdrawal-weighting floating electrodes 352 may be disposed in the parallel arm resonator 301 having the highest resonant frequency frp.

In the acoustic wave filter 10C of the third example, the three continuous withdrawal-weighting floating electrodes 352 are disposed only in the parallel arm resonator 301. Three continuous withdrawal-weighting floating electrodes may be disposed in the series arm resonator 101 having the lowest anti-resonant frequency fas. This can improve the sharpness at the high-frequency edge of the pass band while maintaining the pass band width. Instead of three continuous withdrawal-weighting floating electrodes, two or four or more continuous withdrawal-weighting floating electrodes may be disposed in the series arm resonator 101 having the lowest anti-resonant frequency fas.

In the acoustic wave filter 10C of the third example, the three withdrawal-weighting floating electrodes 352 may be disposed asymmetrically with respect to the center of the IDT electrode in the propagation direction of acoustic waves. That is, in FIG. 8A, the number of electrode fingers disposed in the propagation direction of acoustic waves with respect to the three withdrawal-weighting floating electrodes 352 may be different from that of electrode fingers disposed in the direction opposite the propagation direction of acoustic waves with respect to the three withdrawal-weighting floating electrodes 352.

FIG. 9A is a schematic plan view illustrating an example of the configuration of the IDT electrode of a parallel arm resonator 401 of an acoustic wave filter 10D according to a fourth example of a preferred embodiment of the present invention. The acoustic wave filter 10D of the fourth example is different from the acoustic wave filter 10B of the second example in the configuration of the IDT electrode of the parallel arm resonator 401 having the highest resonant frequency frp. That is, the acoustic wave filter 10D of the fourth example includes series arm resonators 101, 102, 103, 104, and 105, parallel arm resonators 401, 202, 203, and 204, and input/output terminals 310 and 320.

In the acoustic wave filter 10D of the fourth example, the anti-resonant frequencies fap of the parallel arm resonators 401 and 202 through 204 are positioned within the pass band of the acoustic wave filter 10D. Among the parallel arm resonators 401 and 202 through 204, the parallel arm resonator 401 is an acoustic wave resonator having the highest resonant frequency frp.

As shown in FIG. 9A, the IDT electrode of the parallel arm resonator 401 includes a pair of comb-shaped electrodes 401a and 401b, three withdrawal-weighting floating electrodes 452, and reflectors 441 disposed at both sides of the pair of comb-shaped electrodes 401a and 401b. The comb-shaped electrode 401a includes plural electrode fingers 451a and a busbar electrode 461a. The busbar electrode 461a connects one end of an electrode finger 451a and one end of another electrode finger 451a with each other. The comb-shaped electrode 401b includes plural electrode fingers 451b and a busbar electrode 461b. The busbar electrode 461b connects one end of an electrode finger 451b and one end of another electrode finger 451b with each other.

As shown in FIG. 9A, in the acoustic wave filter 10D of the fourth example, the IDT electrode of the parallel arm resonator 401 includes the three withdrawal-weighting floating electrodes 452 which do not sandwich any of the electrode fingers 451b of the comb-shaped electrode 401b therebetween. However, adjacent withdrawal-weighting floating electrodes 452 sandwich one electrode finger 451a of the comb-shaped electrode 401a therebetween. In other words, one electrode finger 451a is interposed between adjacent withdrawal-weighting floating electrodes 452. The IDT electrodes of the series arm resonators 101 through 105 and the parallel arm resonators 202 through 204 do not include any withdrawal-weighting floating electrodes 452, though they are not shown.

The parallel arm resonator having the highest resonant frequency frp may not necessarily be the parallel arm resonator 401, and may be one of the parallel arm resonators 202 through 204. That is, the parallel arm resonator having the highest resonant frequency frp may be any parallel arm resonator regardless of whether or not it is located close to the input/output terminal 310 or 320.

FIG. 9B is a graph illustrating the resonance characteristics of a parallel arm resonator of the acoustic wave filter of the fourth example in comparison with those of the related art. More specifically, the resonance characteristics (bandpass characteristics) of the parallel arm resonator 401 of the acoustic wave filter 10D of the fourth example and those of a parallel arm resonator of an acoustic wave filter of the related art are shown in FIG. 9B.

The acoustic wave filter of the related art has the circuit configuration shown in FIG. 1. In the acoustic wave filter of the related art, however, unlike in the acoustic wave filter 10D, the parallel arm resonator having the highest resonant frequency does not include any withdrawal-weighting floating electrodes or withdrawal-weighting electrodes. That is, none of the parallel arm resonators and series arm resonators have withdrawal-weighting floating electrodes or withdrawal-weighting electrodes.

In the parallel arm resonator 401 of the acoustic wave filter 10D of the fourth example, a new mode having a local minimum point and a local maximum point of the insertion loss is generated between the resonant frequency frp and the anti-resonant frequency fap, as indicated by the broken-line elliptical portion in FIG. 9B. The resonant frequency frp and the anti-resonant frequency fap of the parallel arm resonator 401 roughly match those of the related art. The acoustic wave filter 10D is therefore able to improve the sharpness at the low-frequency edge of the pass band while maintaining the pass band width.

The reason why the above-described new mode is generated between the resonant frequency frp and the anti-resonant frequency fap in the parallel arm resonator 401 may be that the IDT electrode of the parallel arm resonator 401 is divided into two portions at a boundary at which the three withdrawal-weighting floating electrodes 452 are disposed.

In the acoustic wave filter 10D of the fourth example, the three withdrawal-weighting floating electrodes 452 are disposed only in the parallel arm resonator 401 having the highest resonant frequency frp. However, the three withdrawal-weighting floating electrodes 452 may also be disposed in any of the other parallel arm resonators 202 through 204.

Instead of the three withdrawal-weighting floating electrodes 452, four or more withdrawal-weighting floating electrodes 452 may be disposed in the parallel arm resonator 401 having the highest resonant frequency frp.

In the acoustic wave filter 10D of the fourth example, the three withdrawal-weighting floating electrodes 452 are disposed only in the parallel arm resonator 401. Three withdrawal-weighting floating electrodes may be disposed in the series arm resonator 101 having the lowest anti-resonant frequency fas. This can improve the sharpness at the high-frequency edge of the pass band while maintaining the pass band width. Instead of three withdrawal-weighting floating electrodes, four or more withdrawal-weighting floating electrodes may be disposed in the series arm resonator 101 having the lowest anti-resonant frequency fas.

In the acoustic wave filter 10D of the fourth example, the three withdrawal-weighting floating electrodes 452 may be disposed asymmetrically with respect to the center of the IDT electrode in the propagation direction of acoustic waves. That is, in FIG. 9A, the number of electrode fingers disposed in the propagation direction of acoustic waves with respect to the three withdrawal-weighting floating electrodes 452 may be different from that of electrode fingers disposed in the direction opposite the propagation direction of acoustic waves with respect to the three withdrawal-weighting floating electrodes 452.

Acoustic wave filters according to preferred embodiments of the present invention have been described above through illustration of the preferred embodiment and examples. However, acoustic wave filters according to preferred embodiments of the invention are not restricted to the above-described preferred embodiment and examples. Other preferred embodiments obtained by combining certain elements in the above-described preferred embodiment and examples, and modified examples obtained by making various modifications to the above-described preferred embodiment and examples by those skilled in the art without departing from the scope and spirit of the invention are also encompassed in the invention. Various devices integrating any of the acoustic wave filters according to the preferred embodiments and examples are also encompassed in the present invention.

Preferred embodiments of the present invention have widespread use in communication devices, such as cellular phones, for example, as a multiband- and multimode-support acoustic wave filter exhibiting the enhanced sharpness.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
at least one series arm resonator disposed on a path connecting two input/output terminals; wherein
each of the at least one series arm resonator is an acoustic wave resonator including a interdigital transducer electrode provided on a substrate with piezoelectricity;
a resonant frequency of the at least one series arm resonator is within a pass band of the acoustic wave filter;
the interdigital transducer electrode of the at least one series arm resonator includes a pair of comb-shaped electrodes, each of the comb-shaped electrodes including a plurality of electrode fingers and a busbar electrode, the plurality of electrode fingers extending in a direction intersecting a propagation direction of acoustic waves and being disposed in parallel or substantially in parallel with each other, one end of one of the plurality of electrode fingers and one end of another electrode finger of the plurality of electrode fingers being connected with each other by the busbar electrode;
among the plurality of electrode fingers, an electrode finger which is connected to neither of the busbar electrodes is defined as a withdrawal-weighted floating electrode; and
among the at least one series arm resonator, a series arm resonator with a lowest anti-resonant frequency is a first series arm resonator, and the interdigital transducer electrode of the first series arm resonator includes two or more of the withdrawal-weighted floating electrodes, the two or more of the withdrawal-weighted floating electrodes being disposed without any of the plurality of electrode fingers of one of the comb-shaped electrodes interposed therebetween.

2. The acoustic wave filter according to claim 1, wherein the substrate includes:
a piezoelectric film, the interdigital transducer electrode provided on one surface of the piezoelectric film;
a high acoustic velocity support substrate, an acoustic velocity of bulk waves propagating through the high acoustic velocity support substrate being higher than an acoustic velocity of acoustic waves propagating through the piezoelectric film; and
a low acoustic velocity film disposed between the high acoustic velocity support substrate and the piezoelectric film, an acoustic velocity of bulk waves propagating through the low acoustic velocity film being lower than an acoustic velocity of bulk waves propagating through the piezoelectric film.

3. The acoustic wave filter according to claim 1, wherein the two or more of the withdrawal-weighted floating electrodes are disposed with one electrode finger of the another one of the comb-shaped electrodes interposed therebetween.

4. The acoustic wave filter according to claim 1, wherein the two or more of the withdrawal-weighted floating electrodes are continuously disposed without any of the electrode fingers of the another one of the comb-shaped electrodes interposed therebetween.

5. The acoustic wave filter according to claim 1, wherein the two or more of the withdrawal-weighted floating electrodes are disposed asymmetrically with respect to a center of the interdigital transducer electrode in the propagation direction of acoustic waves.

6. The acoustic wave filter according to claim 1, wherein the interdigital transducer includes a contact layer and a main electrode layer provided on the contact layer.

7. The acoustic wave filter according to claim 6, wherein the contact layer is made of Ti.

8. The acoustic wave filter according to claim 6, wherein the main electrode layer is made of Al.

9. The acoustic wave filter according to claim 6, wherein the interdigital transducer includes a protective layer covering the contact layer.

10. The acoustic wave filter according to claim 9, wherein the protective layer includes silicon dioxide as a main component.

11. An acoustic wave filter comprising:
- at least one parallel arm resonator disposed between a ground and a path connecting two input/output terminals; wherein
- each of the at least one parallel arm resonator is an acoustic wave resonator including an interdigital transducer electrode provided on a substrate with piezoelectricity;
- an anti-resonant frequency of the at least one parallel arm resonator is positioned within a pass band of the acoustic wave filter;
- the interdigital transducer electrode includes a pair of comb-shaped electrodes, each of the comb-shaped electrodes including a plurality of electrode fingers and a busbar electrode, the plurality of electrode fingers extending in a direction intersecting a propagation direction of acoustic waves and being disposed in parallel or substantially in parallel with each other, one end of one of the plurality of electrode fingers and one end of another electrode finger of the plurality of electrode fingers being connected with each other by the busbar electrode;
- among the plurality of electrode fingers, an electrode finger which is connected to neither of the busbar electrodes is defined as a withdrawal-weighted floating electrode; and
- among the at least one parallel arm resonator, a parallel arm resonator with the highest resonant frequency is a first parallel arm resonator, and the interdigital transducer electrode of the first parallel arm resonator includes two or more of the withdrawal-weighted floating electrodes, the two or more of the withdrawal-weighted floating electrodes being disposed without any of the plurality of electrode fingers of one of the comb-shaped electrodes interposed therebetween.

12. The acoustic wave filter according to claim 11, wherein the two or more of the withdrawal-weighted floating electrodes are disposed with one electrode finger of the another one of the comb-shaped electrodes interposed therebetween.

13. The acoustic wave filter according to claim 11, wherein the two or more of the withdrawal-weighted floating electrodes are continuously disposed without any of the electrode fingers of the another one of the comb-shaped electrodes interposed therebetween.

14. The acoustic wave filter according to claim 11, wherein the two or more of the withdrawal-weighted floating electrode are disposed asymmetrically with respect to a center of the interdigital transducer electrode in the propagation direction of acoustic waves.

15. The acoustic wave filter according to claim 11, wherein the substrate includes:
- a piezoelectric film, the interdigital transducer electrode provided on one surface of the piezoelectric film;
- a high acoustic velocity support substrate, an acoustic velocity of bulk waves propagating through the high acoustic velocity support substrate being higher than an acoustic velocity of acoustic waves propagating through the piezoelectric film; and
- a low acoustic velocity film disposed between the high acoustic velocity support substrate and the piezoelectric film, an acoustic velocity of bulk waves propagating through the low acoustic velocity film being lower than an acoustic velocity of bulk waves propagating through the piezoelectric film.

16. The acoustic wave filter according to claim 11, wherein the interdigital transducer includes a contact layer and a main electrode layer provided on the contact layer.

17. The acoustic wave filter according to claim 16, wherein the contact layer is made of Ti.

18. The acoustic wave filter according to claim 16, wherein the main electrode layer is made of Al.

19. The acoustic wave filter according to claim 16, wherein the interdigital transducer includes a protective layer covering the contact layer.

20. The acoustic wave filter according to claim 19, wherein the protective layer includes silicon dioxide as a main component.

* * * * *